(12) United States Patent
You et al.

(10) Patent No.: US 11,012,092 B2
(45) Date of Patent: May 18, 2021

(54) POLAR DECODING METHOD AND APPARATUS

(71) Applicant: HUAWEI TECHNOLOGIES CO., LTD., Guangdong (CN)

(72) Inventors: Zhi You, Shanghai (CN); Zheng Zheng, Shanghai (CN); Nan Li, Shanghai (CN); Yulun Zhang, Shanghai (CN); Liang Zhang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/727,655

(22) Filed: Dec. 26, 2019

(65) Prior Publication Data

US 2020/0136651 A1   Apr. 30, 2020

Related U.S. Application Data

(63) Continuation of application No. PCT/CN2017/099202, filed on Aug. 26, 2017.

(51) Int. Cl.
*H03M 13/13* (2006.01)
*H04L 1/00* (2006.01)

(52) U.S. Cl.
CPC .......... *H03M 13/13* (2013.01); *H04L 1/0057* (2013.01)

(58) Field of Classification Search
CPC .... H03M 13/13; H04L 1/0046; H04L 1/0052; H04L 1/0057; H04L 1/0072
See application file for complete search history.

(56) References Cited

U.S. PATENT DOCUMENTS

| | | |
|---|---|---|
| 2013/0019142 A1 | 1/2013 | Teo et al. |
| 2017/0230059 A1 | 8/2017 | Giard et al. |
| 2018/0294920 A1 | 10/2018 | Chen et al. |

FOREIGN PATENT DOCUMENTS

| | | |
|---|---|---|
| CN | 104700346 A | 6/2015 |
| CN | 105720992 A | 6/2016 |
| CN | 106253911 A | 12/2016 |
| CN | 106877973 A | 6/2017 |

(Continued)

OTHER PUBLICATIONS

Huawei, "Construction schemes for polar codes",3GPP TSG RAN WG1 Meeting #88, R1-1701702, Athens, Greece, Feb. 13-17, 2017, 7 pages.

(Continued)

*Primary Examiner* — Shelly A Chase
(74) *Attorney, Agent, or Firm* — Fish & Richardson P.C.

(57) ABSTRACT

The present disclosure relates to polar decoding methods and apparatus. One example method includes obtaining a polar code sequence, determining at least one first information bit length corresponding to a code length of the polar code sequence, and decoding the polar code sequence based on blind detection by using the code length and the at least one first information bit length. The at least one first information bit length is a part of a preset information bit length set corresponding to the code length. A remaining part of the preset information bit length set is at least one second information bit length. The at least one second information bit length is excluded from being used for the blind detection. Each second information bit length is less than one or more information bit lengths in the at least one first information bit length.

20 Claims, 12 Drawing Sheets

(56) References Cited

FOREIGN PATENT DOCUMENTS

CN 106899379 A 6/2017
JP 2004284480 A 10/2004

OTHER PUBLICATIONS

PCT International Search Report and Written Opinion in International Application No. PCT/CN2017/099,202, dated May 11, 2018, 16 pages (With English Translation).
Condo et al., "Blind Detection with Polar Codes," ArXiv:1705.01864v2, XP080946151, May 16, 2017, 7 pages.
Mediatek Inc., "Comparison of coding candidates for DL control channels and extended applications," 3GPP TSG RAN WG1 Meeting #87, R1-1612135, Reno, USA, XP051176090, Nov. 14-18, 2016, 5 pages.
Huawei et al., "On latency, power consumption and implementation complexity for polar codes," 3GPP TSG RAN WG1 Ad-Hoc Meeting, R1-1700090, Spokane, USA, XP051202599, Jan. 16-20, 2017, 10 pages.
Extended European Search Report issued in European Application No. 17922998.4 dated Jun. 23, 2020, 11 pages.
Office Action issued in Chinese Application No. 201780091565.7 dated Dec. 29, 2020, 5 pages.

| Candidate encoding parameters | | |
|---|---|---|
| N | K | |
| 128 | 47 | First group |
| 128 | 49 | First group |
| 128 | 59 | First group |
| 128 | 62 | Second group |
| 128 | 64 | Second group |
| 128 | 67 | Second group |

| 256 | 60 | First group |
|---|---|---|
| 256 | 62 | First group |
| 256 | 64 | First group |
| 256 | 73 | Second group |
| 256 | 75 | Second group |

| 512 | 79 | First group |
|---|---|---|
| 512 | 80 | First group |
| 512 | 81 | Second group |
| 512 | 83 | Second group |

| 1024 | 90 | First group |
|---|---|---|
| 1024 | 100 | First group |
| 1024 | 105 | Second group |

Narrowing →

| Encoding parameters used by polar decoding | |
|---|---|
| N | K |
| 128 | 59 |
| 128 | 62 |
| 128 | 67 |

| 256 | 62 |
|---|---|
| 256 | 73 |
| 256 | 75 |

| 512 | 80 |
|---|---|
| 512 | 81 |
| 512 | 83 |

| 1024 | 100 |
|---|---|
| 1024 | 105 |

POLAR DECODING METHOD AND APPARATUS

CROSS-REFERENCE TO RELATED APPLICATIONS

This application is a continuation of International Application No. PCT/CN2017/099202, filed on Aug. 26, 2017, the disclosure of which is hereby incorporated by reference in its entirety.

TECHNICAL FIELD

This application relates to the field of polar code technologies, and in particular, to a polar decoding method and apparatus.

BACKGROUND

A communications system usually uses channel encoding to improve reliability of data transmission and ensure communication quality. A polar code has been theoretically proved that the polar code can achieve an approximate Shannon capacity and has a simple decoding method. The polar code is a linear block code, a generator matrix of the polar code is $G_N$, and a polar code sequence obtained by using polar encoding is $x_1^N = u_1^N G_N$, where $u_1^N = (u_1, u_2, \ldots, u_N)$ is a binary row vector, and $G_N = F_2^{\otimes(\log_2(N))}$. A code length is $N=2^n$, where n is a positive integer.

$$F_2 = \begin{bmatrix} 1 & 0 \\ 1 & 1 \end{bmatrix},$$

and $F_2^{\otimes(\log_2(N))}$ is a Kronecker product of $F_2$, and is defined as $F^{\otimes(\log_2(N))} = F \otimes F^{\otimes(\log_2(N))-1}$.

In a process of the polar encoding, some bits in $u_1^N$ are used to carry information, and are referred to as information bits. A set of sequence numbers of the information bits is denoted by A. The other bits are preset to fixed values pre-agreed on by both an encoder and a decoder, and are referred to as frozen bits. A set of sequence numbers of the bits is a complementary set of A or a part of the complementary set. Without loss of generality, the frozen bits are usually set to 0. Actually, as long as the encoder and the decoder make a pre-agreement, the frozen bit sequence may alternatively be set to another fixed value, for example, 1. Therefore, an encoded information bit sequence may be obtained by using the following method: $x_1^N = u_A G_N(A)$, where $u_A$ is an information bit set in $u_1^N$; $u_A$ is a row vector of a length K: $|A|=K$, which represents that a quantity of elements in the set A is K; and $G_N(A)$ is a submatrix of the matrix $G_N$, including rows corresponding to indexes in the set A. $G_N(A)$ is a K×N matrix. The code length N and the information bit length K are usually referred to as encoding parameters. For the decoder, the encoding parameters may alternatively be referred to as decoding parameters.

When the decoder performs decoding, to reduce overheads of transmitting signaling between the encoder and the decoder, the decoder may not clearly learn of an encoding parameter used by the encoder from the encoder, that is, does not know the code length N and the information bit length K used by the encoder. In this case, there are a lot of possibilities in an N-value and a K-value. Therefore, the decoder needs to attempt to perform decoding on the polar code sequence by sequentially using different combinations of the N-value and the K-value. Such a process may be referred to as blind detection or blind decoding. The process is similar to blind detection of a PDCCH (physical downlink control channel) in Long Term Evolution (LTE). During blind detection of polar decoding, decoding is performed by sequentially traversing different combinations including all possible values of N and all possible values of K. However, a quantity of times of blind detection performed in an existing polar decoding method is excessively large, and decoding computation amount is large, resulting in high complexity.

SUMMARY

Embodiments of this application provide a polar decoding method and apparatus, to reduce polar decoding complexity. To achieve relevant objectives, the following technical solutions are used in the embodiments of this application.

According to a first aspect, an embodiment of this application provides a polar decoding method, including: obtaining a polar code sequence; determining at least one first information bit length corresponding to a code length of the polar code sequence; and decoding the polar code sequence based on blind detection by using the code length and the at least one first information bit length, where the at least one first information bit length is a part of a preset information bit length set corresponding to the code length, a remaining part of the preset information bit length set is at least one second information bit length, the at least one second information bit length is excluded from being used for the blind detection, and each second information bit length is less than one or more information bit lengths in the at least one first information bit length. In this solution, the polar code sequence has a particular code length, and the at least one first information bit length used for the blind detection is a part, rather than all, of the preset information bit length set corresponding to the code length, so that use of the at least one second information bit length is excluded in the blind detection, thereby reducing a quantity of information bit lengths used in the blind detection. Due to a distinctive nested feature of a polar code, according to the foregoing solution, complexity of the blind detection is reduced while satisfying decoding accuracy as much as possible.

Optionally, the at least one first information bit length is a simplified information bit length set relative to the preset information bit length set.

In a possible implementation solution, each of the at least one first information bit length is greater than the at least one second information bit length. Alternatively, the at least one first information bit length is one or more largest information bit lengths of a plurality of candidate information bit lengths in the preset information bit length set. In this solution, if only one largest information bit length is used for the blind detection, decoding complexity is reduced as much as possible. If more information bit lengths are used for the blind detection, decoding accuracy may be slightly increased. A quantity of the at least one first information bit length used for the blind detection may be flexibly adjusted, to implement a compromise between the decoding complexity and the accuracy.

In another possible implementation solution, the preset information bit length set includes a plurality of groups, at least one group of the plurality of groups includes at least one third information bit length and at least one fourth information bit length, and each of the at least one third information bit length is greater than the at least one fourth information bit length; the at least one first information bit length includes the at least one third information bit length; and the at least one second information bit length includes the at least one fourth information bit length. In this solution, the preset information bit length set including the plurality of candidate information bit lengths may be divided into the plurality of groups, and one or more groups may include the at least one fourth information bit length that is excluded from being used for the blind detection, so that decoding complexity can be reduced. Optionally, the plurality of groups may be divided by a person skilled in the art based on experience or be divided based on simulation data in a design process, so that one or more third information bit lengths used for the blind detection are selected from any one group, and the fourth information bit length is excluded from being used for the blind detection, thereby optimizing performance.

In a possible implementation solution, the determining at least one first information bit length corresponding to a code length of the polar code sequence includes: selecting the at least one first information bit length from the plurality of candidate information bit lengths in the preset information bit length set.

In another possible implementation solution, the at least one first information bit length is preconfigured in an apparatus performing the method. In this solution, the at least one first information bit length used for the blind detection is directly obtained through preconfiguration without performing a selection process, thereby reducing complexity of a decoding operation. The preconfiguration may be preset in the apparatus in a form of software configuration or hardware configuration. Whenever the apparatus needs to perform the blind detection based on the code length, the at least one first information bit length corresponding to the code length is determined by using the software configuration or hardware configuration.

In a possible implementation solution, the code length includes a plurality of code lengths; the determining at least one first information bit length corresponding to a code length of the polar code sequence includes: determining at least one first information bit length corresponding to each code length of the plurality of code lengths; and the decoding the polar code sequence based on blind detection by using the code length and the at least one first information bit length includes: decoding the polar code sequence based on the blind detection by using each code length and the at least one first information bit length corresponding to the code length. In an actual application, there may alternatively be a plurality of code lengths. Therefore, the blind detection needs to be performed based on the plurality of code lengths and a plurality of information bit lengths corresponding to each code length. When a quantity of the code lengths is larger, a quantity of encoding parameters is larger. In this case, use of the method in this solution facilitates reducing the decoding complexity.

Further, the plurality of code lengths may be preconfigured based on a wireless communication protocol in the apparatus performing the method or be configured by a peer device for the apparatus. According to the foregoing solution, both a network node and the apparatus may learn of the plurality of different code lengths required in the blind detection, and the apparatus can reduce the decoding complexity by using the foregoing method when performing the blind detection.

In a possible implementation solution, the preset information bit length set is preconfigured based on the wireless communication protocol in the apparatus performing the method or is configured for the apparatus by the peer device.

According to the foregoing solution, both the network node and the apparatus may learn of the plurality of candidate information bit lengths corresponding to each code length, and the apparatus can reduce the decoding complexity by using the foregoing method when performing the blind detection.

In a possible implementation solution, the polar code sequence is generated from performing polar encoding on a data source by the peer device, and the preset information bit length set is used in the polar encoding. In this solution, a quantity of the at least one first information bit length used by the apparatus performing the decoding method is less than a quantity of the plurality of candidate information bit lengths used by the peer device performing encoding, so that the decoding complexity can be relatively reduced.

In a possible implementation solution, the polar code sequence includes a plurality of candidate polar code sequences; and the decoding the polar code sequence based on blind detection by using the code length and the at least one first information bit length includes: decoding the plurality of candidate polar code sequences based on the blind detection in a serial or parallel manner by using the code length and the at least one information bit length. Optionally, the plurality of candidate polar code sequences are decoded based on the blind detection in the parallel manner, so that a decoding speed can be effectively increased. Alternatively, the plurality of candidate polar code sequences are decoded based on the blind detection in the serial manner, so that software or hardware resource consumption during decoding can be effectively reduced.

Optionally, not all of the plurality of candidate polar code sequences may be specific to an apparatus currently performing the decoding method, and the apparatus needs to decode all of the plurality of candidate polar code sequences based on the blind detection, to obtain a decoding result required by the apparatus. For example, each candidate polar code sequence is a result obtained by a demodulation apparatus through demodulation and output by the demodulation apparatus, namely, a demodulation soft value. The demodulation apparatus may perform at least one of the following demodulation: quadrature phase shift keying (QPSK), binary phase shift keying (BPSK), 16 quadrature amplitude modulation (QAM), 64QAM, or 256QAM, to obtain the demodulation soft value.

Further, at least one candidate polar code sequence of the plurality of candidate polar code sequences is scrambled by using an identifier corresponding to the apparatus performing the method; and the method further includes: separately descrambling, by using the identifier, decoding results corresponding to the plurality of candidate polar code sequences, to identify a decoding result corresponding to the at least one candidate polar code sequence belonging to the apparatus. Optionally, the identifier is a radio network temporary identifier (RNTI). For example, the radio network temporary identifier is an identifier of user equipment in which the apparatus is located.

Optionally, the method may further include cyclic redundancy check (CRC) used to verify the decoding result.

According to a second aspect, an embodiment of this application provides a polar decoding method, including: obtaining a polar sequence; determining a plurality of first encoding parameters: and decoding the polar code sequence based on blind detection by using the plurality of first encoding parameters, where the plurality of first encoding parameters are some of a plurality of candidate encoding parameters, each candidate encoding parameter includes a code length and an information bit length, the plurality of candidate encoding parameters further include at least one second encoding parameter, the at least one second encoding parameter is excluded from being used for the blind detection, the plurality of first encoding parameters include at least one third encoding parameter, the at least one second encoding parameter includes at least one fourth encoding parameter, and the at least one third encoding parameter and the at least one fourth encoding parameter belong to an encoding parameter set and each includes a same first code length. A second information bit length included in each fourth encoding parameter is less than one or more information bit lengths of at least one first information bit length included in the at least one third encoding parameter. Similar to the first aspect, according to the solution, by using a distinctive nested feature of a polar code, the at least one second encoding parameter is excluded from being used for the blind detection, thereby reducing complexity while satisfying decoding accuracy as much as possible.

In a possible implementation solution, a first information bit length included in each third encoding parameter is greater than at least one second information bit length included in the at least one fourth encoding parameter. Alternatively, among all candidate encoding parameters including the first code length, the at least one third encoding parameter has at least one largest first information bit length.

In another possible implementation solution, the encoding parameter set includes a plurality of groups, where at least one group of the plurality of groups includes at least one fifth encoding parameter and at least one sixth encoding parameter, and each of at least one third information bit length included in the at least one fifth encoding parameter is greater than at least one fourth information bit length included in the at least one sixth encoding parameter; the at least one third encoding parameter includes the at least one fifth encoding parameter; and the at least one fourth encoding parameter includes the at least one sixth encoding parameter. Because the encoding parameter includes the plurality of groups, and one or more groups may include an encoding parameter that is excluded from being used for the blind detection, so that decoding complexity can be reduced. Optionally, the plurality of groups may be divided by a person skilled in the art based on experience or be divided based on simulation data in a design process.

In a possible implementation solution, the determining a plurality of first encoding parameters includes: selecting a plurality of first encoding parameters from the plurality of candidate encoding parameters.

In another possible implementation solution, the plurality of first encoding parameters are preconfigured in an apparatus performing the method. The preconfiguration may be preset in the apparatus in a form of software configuration or hardware configuration. Whenever the apparatus needs to perform the blind detection, the plurality of first encoding parameters are determined through the software configuration or hardware configuration.

In a possible implementation solution, the plurality of candidate encoding parameters are preconfigured based on a wireless communication protocol in the apparatus performing the method or are configured by a peer device for the apparatus.

In a possible implementation solution, the polar code sequence is generated from performing polar encoding on a data source by the peer device, and the plurality of candidate encoding parameters are used in the polar encoding.

In a possible implementation solution, the polar code sequence includes a plurality of candidate polar code sequences; and the decoding the polar code sequence based on blind detection by using the plurality of first encoding parameters includes: decoding the plurality of candidate polar code sequences based on the blind detection in a serial or parallel manner by using the plurality of first encoding parameters.

Optionally, not all of the plurality of candidate polar code sequences may be specific to an apparatus currently performing the decoding method, and the apparatus needs to decode all of the plurality of candidate polar code sequences based on the blind detection, to obtain a decoding result required by the apparatus. For example, each candidate polar code sequence is a demodulation soft value from a demodulation apparatus. For example, the demodulation apparatus may perform at least one of the following demodulation: quadrature phase shift keying, binary phase shift keying, 16QAM, 64QAM, or 256QAM.

Further, at least one candidate polar code sequence of the plurality of candidate polar code sequences is scrambled by using an identifier corresponding to the apparatus performing the method: and the method further includes: separately descrambling, by using the identifier, decoding results corresponding to the plurality of candidate polar code sequences, to identify a decoding result corresponding to the at least one candidate polar code sequence belonging to the apparatus. Optionally, the identifier is a radio network temporary identifier. For example, the radio network temporary identifier is an identifier of user equipment in which the apparatus is located.

Optionally, the method may further include cyclic redundancy check used to verify the decoding result.

According to a third aspect, an embodiment of this application provides a polar decoding apparatus, including a processor, a memory, and a connector. The memory is configured to store a computer executable instruction. The processor and the memory are coupled by using the connector. The processor executes the computer executable instruction stored in the memory, to perform, drive, or enable the apparatus to perform the method according to any one of the first aspect, the second aspect, or the possible implementation solutions of the first aspect and the second aspect. Optionally, the connector includes at least one of an interface, a transmission line, or a bus.

According to a fourth aspect, an embodiment of this application provides a polar decoding apparatus, including: an obtaining module, a determining module, and a decoding module. The three units are respectively configured to perform steps in the method according to any one of the first aspect, the second aspect, or the possible implementation solutions of the first aspect and the second aspect.

According to the fourth aspect, optionally, the apparatus further includes a check module. The decoding module is configured to generate a decoding result. The check module is configured to verify the decoding result. Further, the apparatus further includes a descrambling module. At least one candidate polar code sequence of the plurality of candidate polar code sequences is scrambled by using an identifier corresponding to the apparatus. The descrambling module is configured to separately descramble, by using the identifier, decoding results corresponding to the plurality of candidate polar code sequences, to identify a decoding result corresponding to the at least one candidate polar code sequence belonging to the apparatus.

According to a fifth aspect, an embodiment of this application provides a computer readable storage medium. The computer readable storage medium stores a computer executable instruction. When the instruction is run on a computer or a processor, the computer or the processor may be enabled to perform the method according to any one of the first aspect, the second aspect, or the possible implementation solutions of the first aspect and the second aspect.

According to a sixth aspect, an embodiment of this application provides a computer program product including the instruction according to the fifth aspect.

According to a seventh aspect, an embodiment of this application provides a polar decoding apparatus, including an interface circuit, a parameter generator, and a polar decoder. Optionally, any one of the three components includes an integrated circuit, for example, a logic gate or a transistor. In this case, the apparatus is a chip or a chip set including a plurality of chips. The three components respectively perform steps in the method according to any one of the first aspect, the second aspect, or the possible implementation solutions of the first aspect and the second aspect by using logical operations.

Further, in a possible implementation of the seventh aspect, the apparatus further includes at least one of a descrambler or a checker.

According to an eighth aspect, an embodiment of this application provides user equipment, configured to communicate with a peer device. The user equipment may include the apparatus according to the third aspect, the fourth aspect, or the seventh aspect.

According to the eighth aspect, further, the user equipment further includes a demodulation apparatus providing the polar code sequence to the apparatus. The polar code sequence is a demodulation soft value that is generated by the demodulation apparatus by demodulating a received digital signal. For example, the demodulation apparatus may perform at least one of the following demodulation: quadrature phase shift keying, binary phase shift keying, 16QAM, 64QAM, or 256QAM.

Further, the user equipment further includes a transceiver. The transceiver is configured to: receive a radio frequency signal from an antenna, convert the radio frequency signal into a digital baseband signal or a digital intermediate frequency signal, and provide the digital baseband signal or the digital intermediate frequency signal to the demodulation apparatus, so that the demodulation apparatus may demodulate the digital baseband signal or the digital intermediate frequency signal, to generate the demodulation soft value.

Optionally, the transceiver is further configured to: receive the modulated digital baseband signal or digital intermediate frequency signal from a modulation apparatus of the user equipment, convert the modulated digital baseband signal or digital intermediate frequency signal into a radio frequency signal, and send the radio frequency signal by using the antenna.

Optionally, the user equipment may be a mobile phone, a tablet computer, or a wearable device.

According to a ninth aspect, an embodiment of this application provides a device, including a processor, a transceiver, and a connector. The processor and the transceiver are coupled by using the connector. Optionally, the connector includes at least one of an interface, a transmission line, or a bus. The transceiver is configured to: receive a radio frequency signal from an antenna, and converts the radio frequency signal into a digital baseband signal or a digital intermediate frequency signal. The processor is configured to: demodulate the digital baseband signal or the digital intermediate frequency signal to generate a polar code sequence, and further perform the method according to any one of the first aspect, the second aspect, or the possible implementation solutions of the first aspect and the second aspect, to decode the polar code sequence.

According to the ninth aspect, optionally, the processor may include a demodulation apparatus and a decoding apparatus. The decoding apparatus may be the apparatus according to the third aspect, the fourth aspect, or the seventh aspect, and specifically performs the method according to any one of the first aspect, the second aspect, or the possible implementation solutions of the first aspect and the second aspect.

Optionally, the transceiver is further configured to: receive the modulated digital baseband signal or digital intermediate frequency signal from a modulation apparatus of the device, convert the modulated digital baseband signal or digital intermediate frequency signal into a radio frequency signal, and send the radio frequency signal by using the antenna.

Optionally, the device may be a chip or a chip set including a plurality of chips, or a set formed by a chip or a chip set and related driver software. The driver software may include the computer program product mentioned in the sixth aspect.

The foregoing aspects of this application are clearer to understand from descriptions of the following embodiments.

DESCRIPTION OF EMBODIMENTS

The following describes the technical solutions in the embodiments of this application with reference to the accompanying drawings in the embodiments of this application. Unless otherwise specified, "a plurality of" means two or more than two. In addition, to facilitate clear description of the technical solutions in the embodiments of this application, words such as "first" and "second" are used in the embodiments of this application to distinguish between same items or similar items with basically same functions or purposes. A person skilled in the art may understand that the words such as "first" and "second" are not used to restrict a quantity and an implementation sequence.

Figure 1:
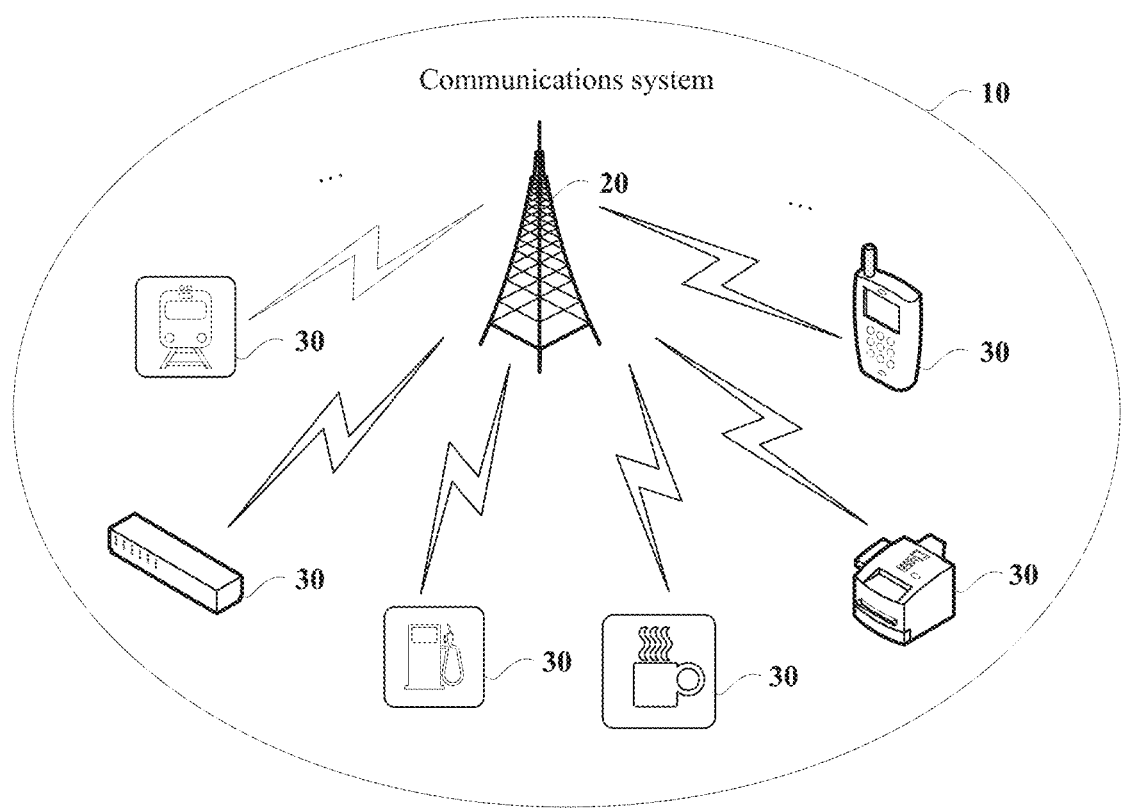
FIG. 1 is a schematic architectural diagram of a communications system according to an embodiment of this application.

A mobile communications network architecture and a service scenario are described in the embodiments of this application, to more clearly describe the technical solutions in the embodiments of this application. A person of ordinary skill in the art may know that, as the mobile communications network architecture evolves and a new service scenario emerges, the technical solutions provided in the embodiments of this application are also applicable to other similar technical issues. As shown in FIG. 1. FIG. 1 shows a communications system 10 according to an embodiment of this application. The communications system 10 includes an access network device 20 and one or more terminals 30 connected to the access network device 20.

The access network device 20 is used as a peer device of the terminal 30, and can provide a wireless communication service for the terminal 30. Because mobile communication is also referred to as cellular communication, the access network device 20 may form one or more cells, and serve a plurality of terminals 30 in the one or more cells. For example, the access network device 20 may be a base station, a relay station, or another radio access point. The base station supports various wireless communication protocols, and may be, for example, a base transceiver station (BTS) in a Global System for Mobile Communications (GSM) or a Code Division Multiple Access (CDMA) network, or may be an NB (NodeB) in Wideband Code Division Multiple Access (WCDMA), or may be an eNB or an eNodeB (evolved NodeB) in Long Term Evolution (LTE), or may be an eNB in IoT or NB-IoT This is not specifically limited in this embodiment of this application. Certainly, the access network device 20 may alternatively be a network device in another network, for example, may be a network device in a future $5^{th}$ generation (5G) mobile communications network or in a future evolved public land mobile network (PLMN), such as a gNodeB.

The terminal 30 is also referred to as user equipment (UE), and may be specifically an access terminal, a terminal unit, a terminal station, a mobile station, a mobile device, a remote station, a remote terminal, a mobile device, a wireless communications device, a terminal agent, a terminal apparatus, or the like. The access terminal may be a handheld device, an in-vehicle device, a portable device, or another type of product having a wireless communication function, for example, a cellular phone, a cordless phone, a Session Initiation Protocol (SIP) phone, a wireless local loop (WLL) station, or a personal digital assistant (PDA); may be a terminal in a future 5G network; or may be a terminal in a future evolved PLMN network. For example, a common form of the terminal 30 is an intelligent terminal, including a mobile phone, a tablet computer, or a wearable device. This is not specifically limited in this embodiment of this application. The terminal 30 may support at least one of the foregoing various wireless communication protocols supported by the access network device 20, to communicate with the access network device 20.

Figure 2:
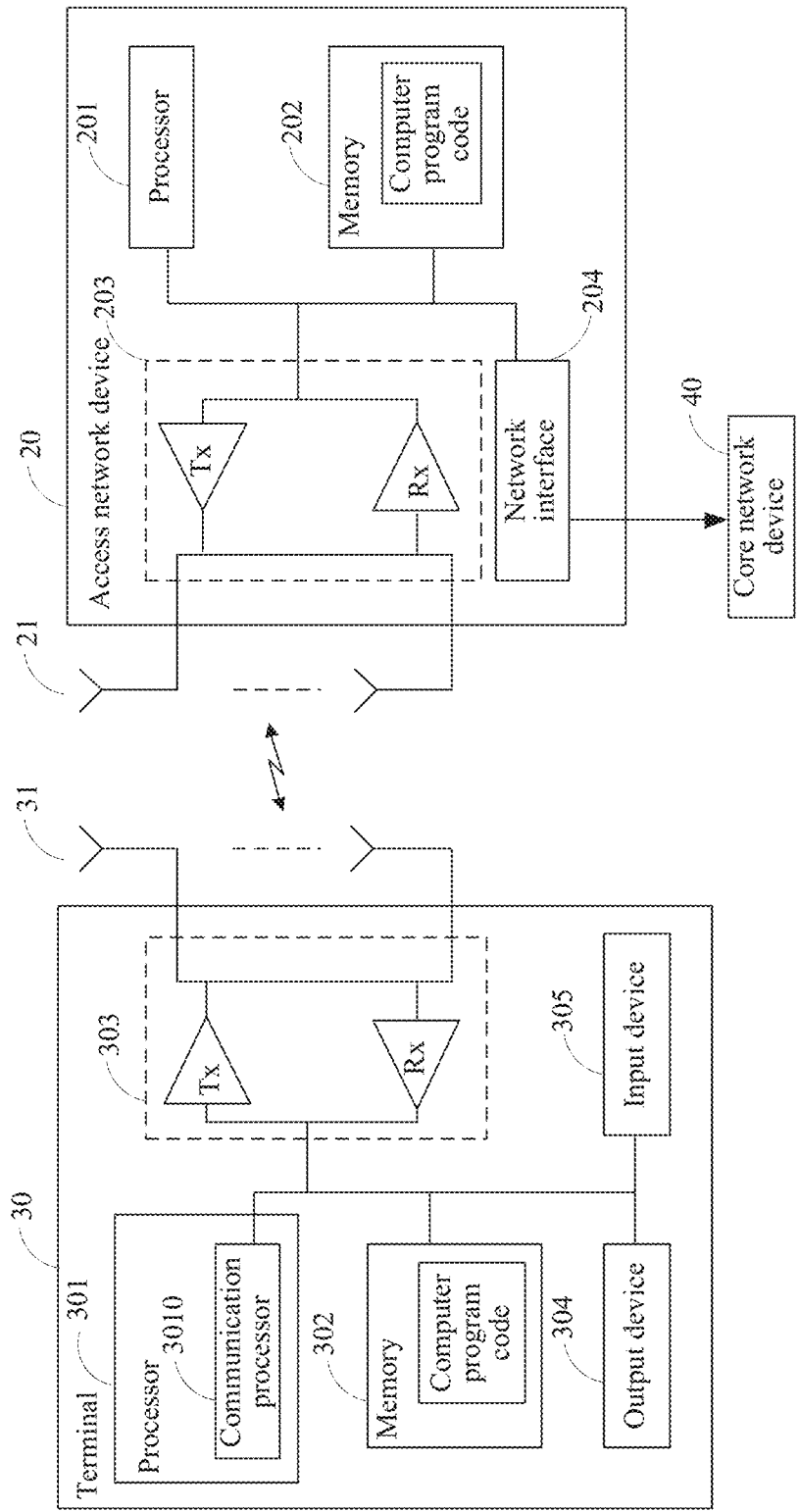
FIG. 2 is a schematic diagram of hardware structures of an access network device 20 and a terminal 30 in communication according to an embodiment of this application.

As shown in FIG. 2, FIG. 2 is a schematic diagram of hardware structures of an access network device 20 and a terminal 30 according to an embodiment of this application. The terminal 30 includes at least one processor 301, at least one memory 302, and at least one transceiver 303. Optionally, the terminal 30 may further include one or more antennas 31, an output device 304, and an input device 305.

The processor 301, the memory 302, and the transceiver 303 are coupled to each other by using a connector. The connector may include various types of interfaces, a transmission line, or a bus. This is not limited in this embodiment. In the embodiments of this application, coupling refers to an interconnection implemented in a particular manner, and includes direct connection or indirect connection implemented by using another device. The processor 301 may include at least one type of the following components: a central processing unit (CPU), a digital signal processor (DSP), a microprocessor, an application-specific integrated circuit (ASIC), a microcontroller unit (MCU), a field programmable gate array (FPGA), or an integrated circuit used to implement a logical operation. For example, the processor 301 may be a single-CPU processor or a multi-CPU processor. A plurality of processors or units included in the processor 301 may be integrated to a chip or to a plurality of different chips. For example, as shown in FIG. 2, the processor 301 may include a communication processor 3010.

In this embodiment of the present invention, the chip is a system fabricated on a same semiconductor substrate by using an integrated circuit process, and is also referred to as a semiconductor chip. The chip may be a set of integrated circuits fabricated on the substrate (which is usually a semiconductor material such as silicon) by using the integrated circuit process, and an outer layer of the chip is usually packaged with a semiconductor packaging material. The integrated circuit may include various functional components. Each type of functional component includes a logic gate circuit, a metal oxide semiconductor (MOS) transistor, or a transistor such as a bipolar transistor or a diode, and may also include another part such as a capacitor, a resistor, or an inductor. Each functional component may independently operate or operate under action of necessary driver software, and may implement various functions such as communication, operation, or storage.

The memory 302 in FIG. 2 may be a nonvolatile memory, for example, an EMMC (embedded multimedia card), a UFS (universal flash storage), or a read-only memory (ROM), or may be another type of static storage device that may store static information or an instruction, or may be a volatile memory, for example a random access memory (RAM) or another type of dynamic storage device that may store information and an instruction, or may be an electrically erasable programmable read-only memory (EEPROM), a compact disc read-only memory (CD-ROM), or another compact disc storage, an optical disc storage (including a compact disc, a laser disc, an optical disc, a digital versatile disc, a Blu-ray disc, and the like), a magnetic disk storage medium or another magnetic storage device, or any other computer readable storage media that can be configured to carry or store program code in a structure form of an instruction or data and that can be accessed by a computer. No limitation is set thereto. The memory 302 may independently exist, and be coupled to the processor 301 by using the connector. The memory 302 may alternatively be integrated with the processor 301. The memory 302 can store various computer program code including program code for performing the solutions of this application. Execution of the program code is controlled by the processor 301, and the executed various computer program code may be considered as a driver of the processor 301. For example, the processor 301 is configured to execute the computer program code stored in the memory 302, to implement the method in the subsequent embodiments of this application. An amount of the computer program code is quite large, and the computer program code may form a computer executable instruction that can be executed by at least one of the processors 301, to drive an associated processor to perform various processing, for example, a communication signal processing algorithm supporting the foregoing various wireless communication protocols, operating system running, or application running.

The transceiver 303 may be any apparatus configured to receive and transmit a communication signal, for example, a radio frequency transceiver, and the transceiver 303 may be specifically coupled to the antenna 31. The transceiver 303 includes a transmitter Tx and a receiver Rx. Specifically, the one or more antennas 31 may receive a radio frequency signal. The receiver Rx of the transceiver 303 is configured to: receive the radio frequency signal from the antenna, convert the radio frequency signal into a digital baseband signal or a digital intermediate frequency signal, and provide the digital baseband signal or the digital intermediate frequency signal to the communication processor 3010 included in the processor 301, so that the communication processor 3010 further processes the digital baseband signal or the digital intermediate frequency signal, for example, demodulation processing and decoding processing. In addition, the transmitter Tx of the transceiver 303 is further configured to: receive the modulated digital baseband signal or digital intermediate frequency signal from the communication processor 3010, convert the modulated digital baseband signal or digital intermediate frequency signal into a radio frequency signal, and send the radio frequency signal by using the one or more antennas 31. Specifically, the receiver Rx may selectively perform one-stage or multistage downconversion processing and analog-to-digital conversion processing on the radio frequency signal, to obtain the digital baseband signal or the digital intermediate frequency signal. A sequence of the downconversion processing and the analog-to-digital conversion processing may be adjusted. The transmitter Tx may selectively perform one-stage or multistage upconversion processing and digital-to-analog conversion processing on the modulated digital baseband signal or digital intermediate frequency signal, to obtain the radio frequency signal. A sequence of the upconversion processing and the digital-to-analog conversion processing may be adjusted. The digital baseband signal and the digital intermediate frequency signal may be collectively referred to as a digital signal.

The output device 304 communicates with the processor 301, and may display information in a plurality of manners. For example, the output device 304 may be a liquid crystal display (LCD), a light emitting diode (LED) display device, a cathode ray tube (CRT) display device, a projector, or the like. The input device 305 communicates with the processor 301, and may receive an input of a user in a plurality of manners. For example, the input device 305 may be a mouse, a keyboard, a touchscreen device, a sensing device, or the like.

The access network device 20 includes at least one processor 201, at least one memory 202, at least one transceiver 203, one or more antennas 21, and at least one network interface 204. The processor 201, the memory 202, the transceiver 203, and the network interface 204 are coupled to each other by using a connector. The network interface 204 is configured to be coupled to a core network device 40 by using a communications link such as an S1 interface. Alternatively, the network interface 204 is connected to a network interface of another access network device by using a line link or a radio link such as an X2 interface. A connection manner is not specifically shown in the figure, and a specific connection manner is not specifically limited in this embodiment of this application. In addition, for related descriptions of the antenna 21, the processor 201, the memory 202, and the transceiver 203, refer to the descriptions of the antenna 31, the processor 301, the memory 302, and the transceiver 303 in the terminal 30, to implement similar functions. For example, the processor 201 may include a communication processor, configured to: perform polar encoding on information or data that needs to be sent to the terminal 30, to obtain a polar code sequence, and modulate the polar code sequence to generate modulated data, so that the modulated data is transmitted to the antenna by using a transmitter Tx in the transceiver 203. Details are not described herein again.

It may be understood that, the foregoing application scenario is described by using a mobile communication scenario as an example, and an associated scenario may alternatively be a short range communication scenario. For example, the terminal 30 may alternatively be user equipment in short range communications, and the access network device 20 may alternatively be an access point in the short range communication. Both the access point in the short range communication and the access network device 20 in the mobile communication may be considered as different types of peer devices corresponding to the terminal 30. Protocols for the short range communication may include Wireless Local Area Network (WLAN), Bluetooth. Wireless Fidelity (Wi-Fi), Infrared. Near-field Communication (NFC), and the like. For example, the user equipment may be Wi-Fi user equipment, and the access point may be a Wi-Fi router.

Based on the foregoing descriptions, this embodiment of the present invention may alternatively be extended to more communication application scenarios. This is not limited in this embodiment, although the subsequent embodiments are described by mainly using the mobile communication scenario as an example. It may be understood that, a communications device used by a user in any communication scenario including polar encoding/decoding may be considered as user equipment, and a device communicating with a device held by the user may be considered as a peer device, for example, a peer device in point-to-point communication.

Figure 3:
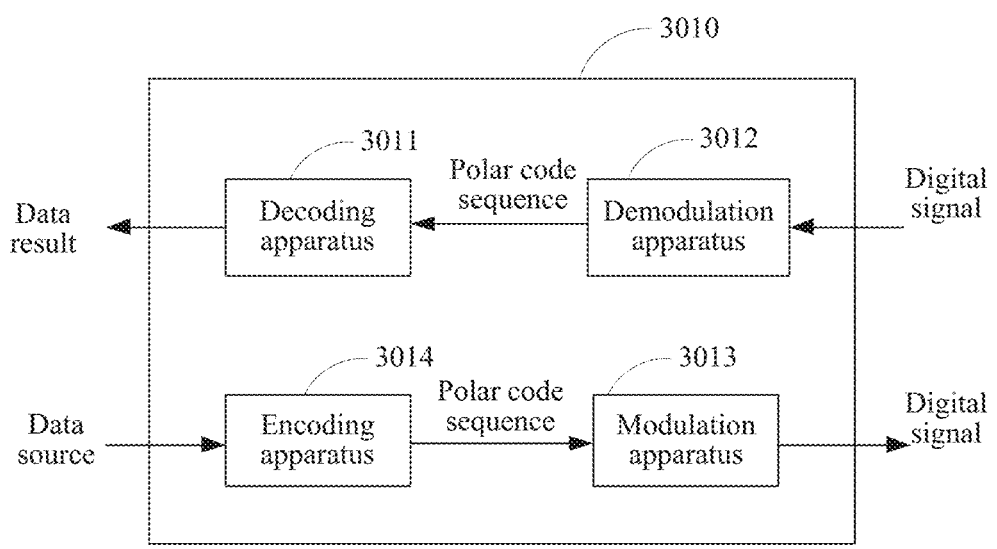
FIG. 3 is a schematic structural diagram of a communication processor in a communications terminal according to an embodiment of this application.

As shown in FIG. 3, FIG. 3 is a schematic structural diagram of a typical communication processor 3010 inside a processor 301 of a terminal 30 in a mobile communication scenario. It may be understood that a structure of a communication processor inside a processor 201 of an access network device 20 is similar. The communication processor 3010 may perform a communication algorithm function, to perform, during reception, demodulation and decoding operations on a digital signal received from a transceiver 303, to obtain a desired data result. The data result indicates recovery of a sending signal of a communication peer. In a sending process, the communication processor 3010 performs modulation and encoding operations on a data source, to obtain a to-be-sent digital signal, and provides the digital signal to the transceiver 303. Related information or data is finally sent to the communications peer device. The communication processor 3010 may be a baseband processor.

The communication processor 3010 includes a decoding apparatus 3011, a demodulation apparatus 3012, a modulation apparatus 3013, and an encoding apparatus 3014. It may be understood that the encoding apparatus 3014 and the decoding apparatus 3011 perform encoding and decoding operation that correspond to each other. In this embodiment, the encoding apparatus 3014 and the decoding apparatus 3011 perform encoding and decoding, respectively. The modulation apparatus 3013 and the demodulation apparatus 3012 perform modulation and demodulation operations that correspond to each other, including processing of a constellation point in communication. The modulation or demodulation may include at least one of the following: quadrature phase shift keying, binary phase shift keying, 16QAM, 64QAM, 256QAM, or the like. Specifically, in reception processing, the demodulation apparatus 3012 is configured to perform a demodulation operation on a received digital signal, specifically including a mapping operation of the constellation point and demodulation decision, to obtain a demodulation result, that is, a demodulation soft value. In this case, because the demodulation soft value is not decoded, the demodulation soft value exists in a form of a polar code sequence. The decoding apparatus 3011 is configured to decode the polar code sequence, to obtain a decoding result. The decoding result is a data result provided to a user or another device for further use after being processed by the communication processor 3010, and may include various types of signals such as a speech signal, a data signal, a video signal, and a control instruction. In sending processing, the encoding apparatus 3014 performs polar encoding on a to-be-sent data source, to obtain a polar code sequence. The polar code sequence is demodulated by the modulation apparatus 3013, to obtain a digital signal, so that the transceiver 303 further performs sending processing.

One or more of the decoding apparatus 3011, the demodulation apparatus 3012, the modulation apparatus 3013, and the encoding apparatus 3014 may be implemented by software, hardware, or a combination of software and hardware. A hardware form means that the module is formed by hardware such as an integrated circuit, a logic gate circuit, or a transistor. A software form means that the module is a module formed by computer program code or a computer executable instruction, and may be implemented by the communication processor 3010.

In addition to content in the structure shown in FIG. 3, the communication processor 3010 may further include another function required by another communication processing, for example, a necessary function such as communication rate adjustment, signal interleaving, digital gain adjustment, digital frequency modulation, multi-input multi-output (MIMO) processing, precoding processing, predistortion processing, communication protocol processing, or power consumption status management. This is not further described in this embodiment.

In a process of performing decoding by the decoding apparatus 3011 corresponding to FIG. 3, to reduce overheads of transmitting signaling between the terminal 30 and the access network device 20, the terminal 30 and the access network device 20 do not negotiate an encoding parameter of the polar code sequence, for example, a code length N and an information bit length K. In an example, the code length N is a fixed value, but there are a plurality of different information bit length K values. In another more common example, the code length N is not fixed. In other words, there are a plurality of different code length N values, and each code length N value may correspond to a plurality of different information bit length K values. The code length N values and the information bit length K values are combined to form a plurality of candidate encoding parameters, and may be used by the access network device 20 for polar encoding. Therefore, the decoding apparatus 3011 in the terminal 30 needs to perform blind detection on a polar code sequence received from the access network device 20, to obtain a decoding result. The blind detection refers to tentative decoding of the polar code sequence by using a plurality of possible encoding parameters. To be specific, all possible values of an associated encoding parameter are traversed in the decoding. The blind detection in the polar decoding is similar to a blind detection technology in Long Term Evolution. Principles thereof are both that all possible values of a type of parameter are traversed to detect or decode to-be-detected data or signal by using each value.

Figure 4:
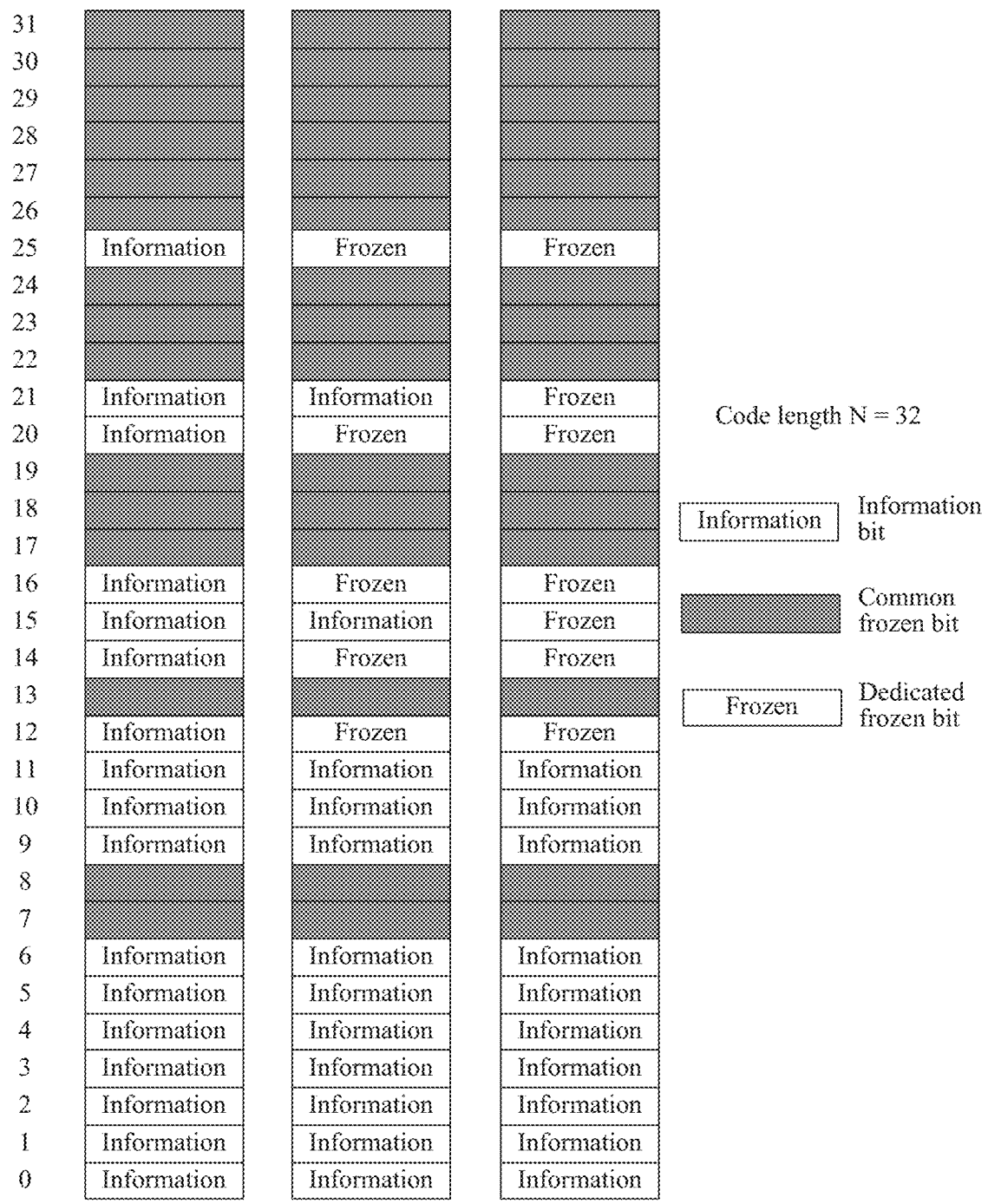
FIG. 4 is a schematic diagram of a nested feature of a polar code according to an embodiment of this application.

It is found from researches that a polar code has a nested feature. Therefore, according to the technical solution in this embodiment, the polar decoding based on the blind detection may be simplified by using the nested feature. The nested feature is briefly described below, to facilitate understanding the subsequent embodiments. In the polar code, a plurality of information bits and a plurality of frozen bits exist. The information bits are used to transmit information, for example, service data or control information. The frozen bits are not used to transmit information, but are preset to preset values, for example, 0 or 1. As shown in FIG. 4, a code length N of a polar code sequence is specified as 32. In other words, a complete segment of polar code includes 32 bits, each bit is also referred to as a sub-channel, and corresponding sequence numbers are from 0 to 31. It is assumed that an information bit length of the polar code is selected from a set M, where M={K1, K2, K3}={17, 12, 10}. That is, for the polar code of N=32, the information bit length used for blind detection of the polar code may have three values 17, 12, and 10. A two-dimensional variable [N_K] including the code length and the information bit length is defined as an encoding parameter. Relative reliability of each sub-channel of the polar code sequence is calculated based on three cases of [N_K]: [32_17], [32_12], and [32_10]. For the three different values of the bit length K, FIG. 4 shows each sub-channel corresponding to each K value, that is, a polarization status of each bit. A block indicated as "information" is an information bit, a block indicated with a deep color is a common frozen bit corresponding to the three K values, and a block indicated as "frozen" is a dedicated frozen bit corresponding to one of the K values. Using the largest K=17 among the three K values as an example, a deep-color frozen bit of the value is also a frozen bit corresponding to the other two K values, that is, the common frozen bit. Therefore, a common frozen bit always exists regardless of a quantity of K values. Therefore, when K is 17, a plurality of information bits in the polar code include a plurality of information bits, in a polar code, existing when K is 12 or 10. This relationship is the nested feature. In other words, a plurality of information bits, in a polar code having a relatively small K value are some of a plurality of information bits, in a polar code, having a relatively large K value.

In the foregoing process, an encoder and a decoder, for example, the access network device 20 and the terminal 30 that generate the polar code sequence, may determine, by using a same reliability calculation method, which bits corresponding to a specified code length are information bits or frozen bits. Both the encoder and the decoder may separately determine, specific to the code length, an information bit and a frozen bit in the polar code through calculation. The information bit is a sub-channel or a bit whose reliability is relatively high, and the frozen bit is a sub-channel or a bit whose reliability is relatively low. There are a plurality of reliability calculation manners, and researches on the methods have been made in the prior art. Regardless of which reliability calculation manner is used, when an information bit of a polar code sequence is determined specific to a code length, a plurality of information bits determined when K is a relatively large value include a plurality of information bits determined when K is a relatively small value. The nested feature is a characteristic of the polar code sequence.

Expansively, in addition to the information bit and the frozen bit, the polar code may include another type of bit, for example, a bit that is jointly agreed on by the terminal and the access network device and that has a particular function. Regardless of a bit type further included in the polar code, for a same code length, information bits having different lengths that are obtained in a same reliability calculation manner all satisfy the nested feature, and all may be applied to solutions provided in the following embodiments.

Figure 5:
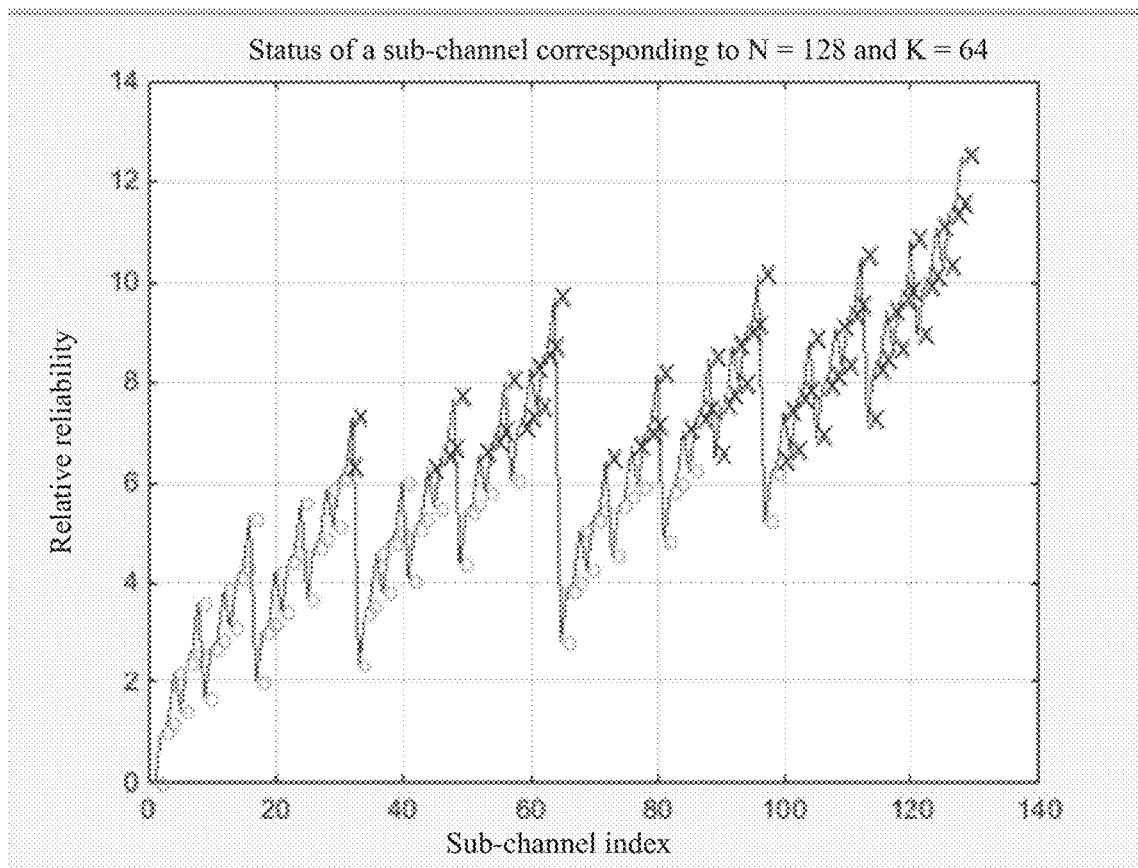
FIG. 5 is a schematic diagram of a sub-channel polarization status of a polar code sequence having a code length N of 128 and an information bit length K of 64 according to an embodiment of this application.
Figure 6:
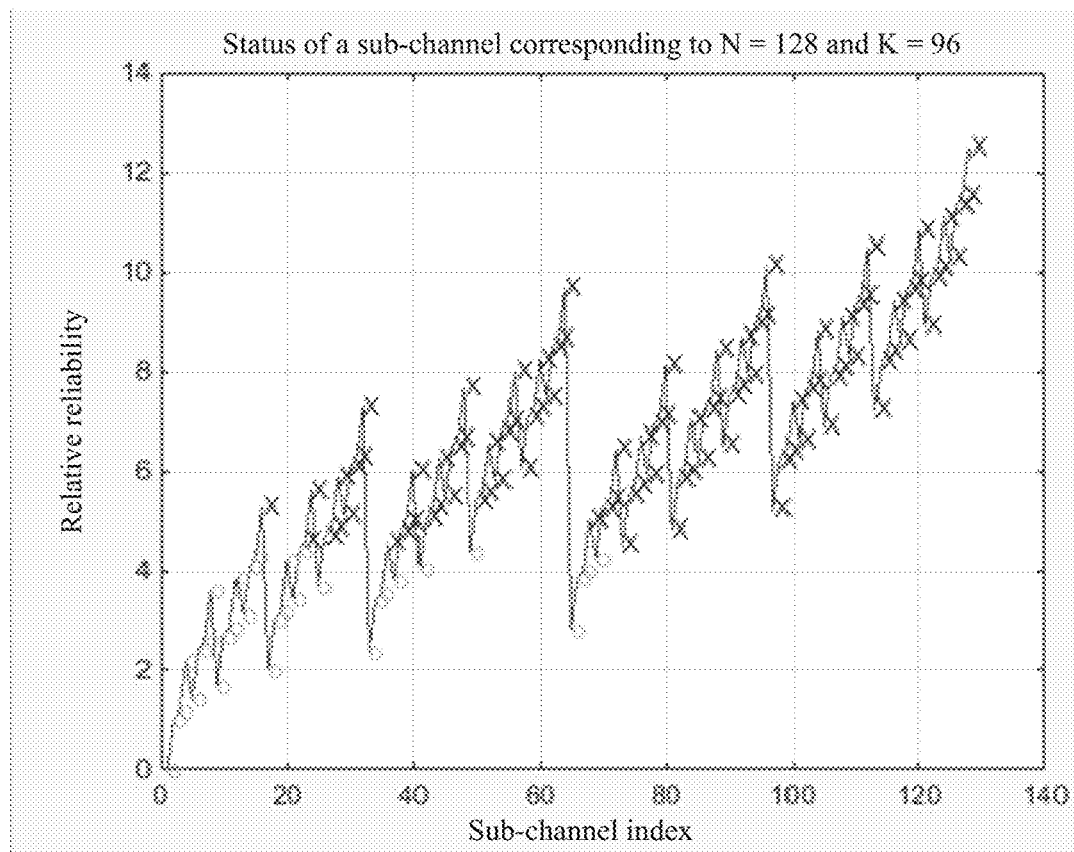
FIG. 6 is a schematic diagram of a sub-channel polarization status of a polar code sequence having a code length N of 128 and an information bit length K of 96 according to an embodiment of this application.

Further, FIG. 5 shows a sub-channel polarization status, presented when a reliability calculation method is used, of a polar code sequence having a code length N of 128 and an information bit length K of 64. A horizontal axis represents a sub-channel or a bit. A vertical axis represents relative reliability of each sub-channel. When the reliability calculation method is used, a bit with high reliability is selected as an information bit, which is represented by "x" in the figure. A frozen bit has lower reliability, and is represented by "c.". Relatively, FIG. 6 shows a sub-channel polarization status, presented when the same reliability calculation method is used, of a polar code sequence having a code length N of 128 and an information bit length K of 96. It may be learned from comparison between FIG. 5 and FIG. 6 that, when the same reliability calculation method is used, and the code length N is fixed, 96 information bits determined when K is 96 include 64 information bits determined when K is 64. In view of this, according to this embodiment of the present invention, a quantity of encoding parameters used for blind detection in the polar decoding is properly decreased, that is, a parameter set including a plurality of candidate encoding parameters is simplified. According to this embodiment, a quantity of information bit lengths, used for blind detection, corresponding to each code length is decreased, to reduce complexity of the blind detection and satisfy decoding accuracy as much as possible.

Figure 7:
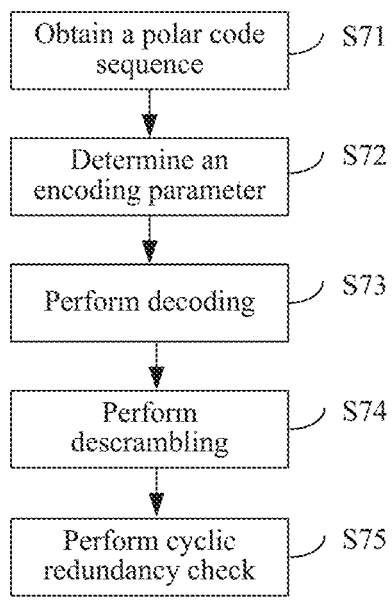
FIG. 7 is a schematic flowchart of a polar decoding method according to an embodiment of this application.

FIG. 7 shows a polar decoding method according to an embodiment of the present invention. The method may be performed by the decoding apparatus 3011 in FIG. 3. The method includes: in S71, obtaining a polar code sequence. Specifically, the polar code sequence may be a demodulation soft value provided by a demodulation apparatus 3012. Specifically, the decoding apparatus 3011 may receive, by using a dedicated software or hardware interface, the polar code sequence provided by the demodulation apparatus 3012. Further, in S72, a plurality of first encoding parameters are determined. The plurality of first encoding parameters are some of a plurality of candidate encoding parameters. In addition to the plurality of first encoding parameters, the plurality of candidate encoding parameters further include at least one second encoding parameter. Each of the plurality of candidate encoding parameters may include a code length N and an information bit length K. The plurality of candidate encoding parameters form a set. In the set, only the plurality of first encoding parameters are used for blind detection, and the at least one second encoding parameter is excluded from being used for the blind detection. An information bit length included in each excluded second encoding parameter needs to be less than an information bit length included in one or more first encoding parameters used for the blind detection. In this way, a nested feature of a polar code is fully considered, so that an encoding parameter including a relatively large information bit length is retained and used for decoding, to facilitate reducing complexity while satisfying decoding accuracy.

In FIG. 7, further, in S73, the polar code sequence is decoded based on the blind detection by using the plurality of first encoding parameters, to obtain a decoding result. In other words, according to the solution in this embodiment, a preset encoding parameter set is simplified, forming a simplified information bit length set, which is alternatively referred to as a narrowed set. The narrowed set includes only the plurality of first encoding parameters, so that a calculation amount is reduced when the blind detection is performed. For how to obtain the narrowed set, to make the first encoding parameter including a relatively large information bit length is retained and the at least one second encoding parameter is excluded, the subsequent embodiments further provide descriptions. Further, in S74, a descrambling operation may be performed on the decoding result, to obtain a decoding result exclusively belonging to the terminal 30. In S75, cyclic redundancy check is further performed for the decoding result. For specific descriptions of related operations, refer to the subsequent embodiments.

Figure 8:
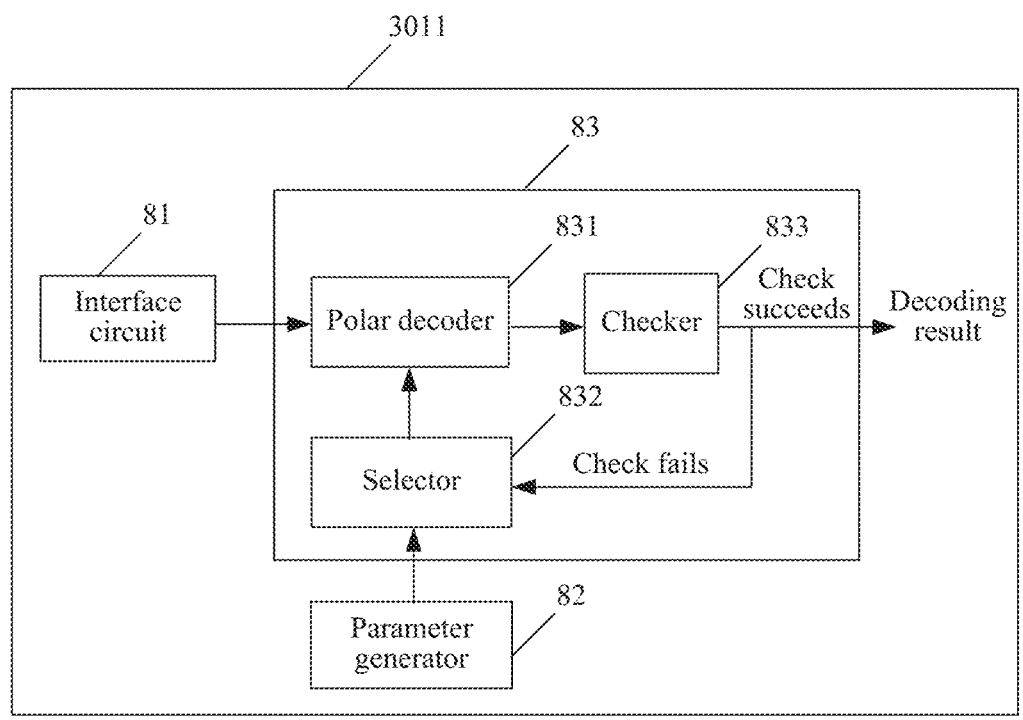
FIG. 8 is a schematic structural diagram of a polar decoding apparatus in a hardware form according to an embodiment of this application.

Referring to FIG. 8, FIG. 8 is a schematic structural diagram of an embodiment of a decoding apparatus 3011 in a hardware form. The decoding apparatus 3011 may include an interface circuit 81, a parameter generator 82, and a decoder 83. Any one of the three components includes an integrated circuit, for example, a logic gate or a transistor. Therefore, the decoding apparatus 3011 in FIG. 8 is a circuit structure formed by hardware, for example, is a chip or a chip set including a plurality of chips. The interface circuit 81 may be configured to perform S71, that is, receive a demodulation soft value from a demodulation apparatus 3012, that is, a polar code sequence obtained through demodulation. The interface circuit 81 sends the received polar code sequence to the decoder 83. The parameter generator 82 is configured to perform S72. The decoder 83 is configured to perform processes S73, S74, and S75.

In a possible example of FIG. 8, the parameter generator 82 may be configured to select a plurality of first encoding parameters used for blind detection from a plurality of preset candidate encoding parameters. A manner in which the plurality of first encoding parameters are obtained through selection is an online mode, that is, the plurality of first encoding parameters are determined during decoding. The plurality of candidate encoding parameters may be predetermined based on a wireless communication protocol for a terminal 30 or may be configured by an access network device 20 for a terminal 30, so that the parameter generator 82 further selects a plurality of appropriate first encoding parameters from the plurality of predetermined or configured candidate encoding parameters. A manner in which the plurality of first encoding parameters are obtained through preconfiguration is an offline mode, that is, the plurality of first encoding parameters are determined in advance. For example, the plurality of candidate encoding parameters are determined based on the wireless communication protocol, and the access network device 20 performs encoding based on the plurality of candidate encoding parameters. The access network device 20 may perform polar encoding on a data source of the access network device 20, to generate the polar code sequence. For the terminal 30, a soft value obtained through demodulation by the terminal 30 by using the demodulation apparatus 3012 is a recovered polar code sequence generated by the access network device 20. In the decoding apparatus 3011 of the terminal 30, a plurality of used first encoding parameters are only some of the plurality of candidate encoding parameters that are possibly used by the access network device 20 during the encoding. That is, it is not required that all encoding parameters determined based on the wireless communication protocol or configured by the access network device 20 for the terminal 30 need to be traversed during the blind detection, thereby reducing complexity of the blind detection.

In another possible example of FIG. 8, the plurality of first encoding parameters are preconfigured without performing a selection operation. The preconfiguration may be presetting the plurality of first encoding parameters in the terminal 30 in a form of software configuration or hardware configuration by the access network device 20. The parameter generator 82 may be configured to obtain a plurality of preconfigured first encoding parameters. For example, for a hardware configuration form, the parameter generator 82 may be a one time programmable (OTP) memory, and an original equipment manufacturer (OEM) of the terminal 30 may program the memory before the terminal 30 is delivered, to configure the plurality of first encoding parameters in the memory. It may be understood that the memory may alternatively be programmed by a chip design manufacturer or a chip vendor, to implement the configuration. For another example, for another hardware configuration form, the parameter generator 82 may be a calculation circuit, and is configured to generate the plurality of first encoding parameters through a preconfigured logical operation. Whenever a polar decoding function is enabled or triggered, the parameter generator 82 performs the calculation. Therefore, the plurality of first encoding parameters are configured in the terminal 30 in a manner of hard logic. For another example, for a soft configuration form, the parameter generator 82 may be a parameter read circuit, and is configured to read a plurality of prestored first encoding parameters from the memory 302 of the terminal 30 or another storage device. Because the plurality of first encoding parameters are preconfigured in the terminal 30 without performing the selection operation, operations are further simplified.

The decoder 83 in FIG. 8 may further include a polar decoder 831, a selector 832, and a checker 833. The selector 832 is configured to: receive the plurality of first encoding parameters provided by the parameter generator 82, select an encoding parameter from the plurality of first encoding parameters, and provide the encoding parameter to the polar decoder 831. The polar decoder 831 is configured to process polar decoding in S73, to obtain a decoding result. A method used by the polar decoder 83 includes, but is not limited to, a successive cancellation (SC) algorithm, a successive cancellation list (SCL) algorithm, or any variant algorithm based on the two algorithms. The checker 833 further performs S74, that is, performs cyclic redundancy check for the decoding result. If the check succeeds, the decoding result is output by the checker 833. If the check fails, the decoding is not successful. The checker 833 feeds back a check failure result to the selector 832, so that the selector 832 selects another encoding parameter and provides the selected new encoding parameter to the polar decoder 831, and a decoding process is continuously iterated until the decoding is successful. The foregoing iteration process is also a process in which all of the plurality of first encoding parameters are continuously used to perform the blind detection in sequence, to complete decoding based on the blind detection.

In FIG. 8, the checker 833 directly uses a plurality of candidate encoding parameters to attempt, in sequence, to perform a check operation on the decoding result obtained by the polar decoder 831. A plurality of first encoding parameters used in the polar decoder 831 are some of the plurality of candidate encoding parameters, so that decoding is simplified. Because the polar decoding occupies most of a calculation amount during operation, the simplification can achieve an obvious beneficial effect. Different from a simplified operation of the polar decoder 831, when performing the check operation, the checker 833 still needs to traverse each of the plurality of candidate encoding parameters, and use all candidate encoding parameters to perform the check in sequence until the check succeeds. It may be understood that, because a calculation amount of the checker 833 is less than that in the polar decoding, the traversing operation cannot increase a calculation amount of a whole solution. This is specifically described subsequently.

Figure 9:
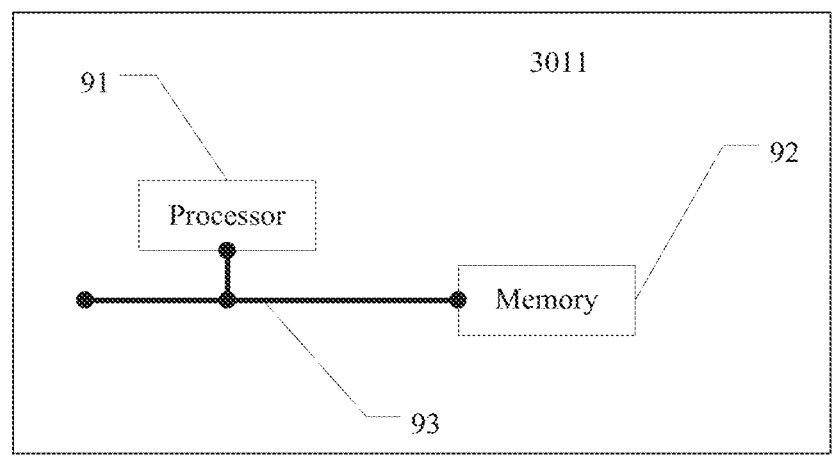
FIG. 9 is a schematic structural diagram of a polar decoding apparatus including a processor that can execute a computer executable instruction according to an embodiment of this application.

It may be understood that, the decoding apparatus 3011 in FIG. 8 may be implemented by software in addition to being implemented by using the foregoing hardware structure. As shown in FIG. 9, the decoding apparatus 3011 may include a processor 91, a memory 92, and a connector 93. The memory 92 may be the memory 302 in FIG. 2. In this case, the memory 302 in FIG. 2 may be placed in the decoding apparatus 3011 of the processor 301. Certainly, the memory 92 may alternatively be another memory. The memory 92 may be configured to store a computer executable instruction. The processor 91 and the memory 92 are coupled by using the connector 93. The processor 91 executes the computer executable instruction stored in the memory 92, to perform the polar decoding processing mentioned in the foregoing embodiment, or to drive or enable the decoding apparatus 3011 to perform the encoding. It should be understood that the connector 93 may include various interfaces, a transmission line, a bus, or the like. This is not limited in this embodiment.

A person skilled in the art may understand that the decoding apparatus 3011 may alternatively be implemented by a combination of software and hardware in addition to being implemented by software or hardware. For example, one or more of a plurality of components corresponding to FIG. 8 may alternatively be implemented by a processor executing a computer executable instruction. Therefore, the foregoing computer executable instruction that is used to drive or enable the decoding apparatus 3011 or that is used by the processor to perform polar decoding processing may be considered as a software product, namely, a computer program product, and may be stored in a computer readable storage medium in any form. For specific descriptions, refer to foregoing descriptions of the memory 302. The software product including the computer executable instruction may include an executing unit configured to perform each step in FIG. 7.

Figures 10, 11:
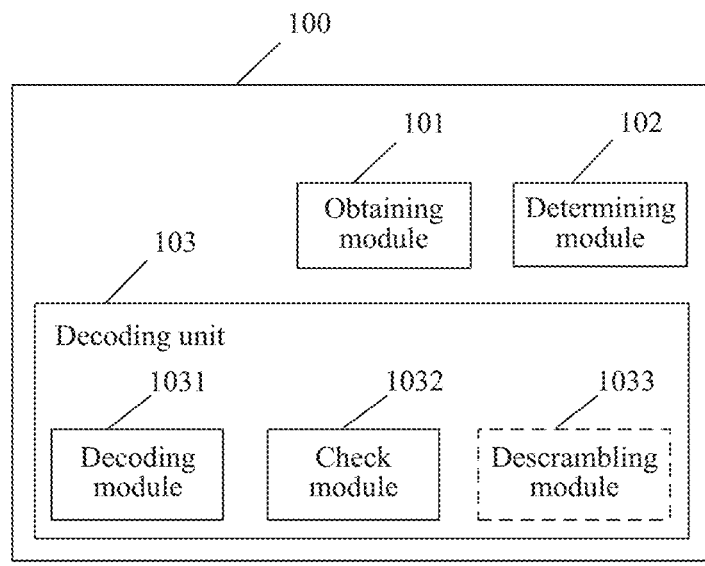
FIG. 10 is a schematic structural diagram of another polar decoding apparatus according to an embodiment of this application.
FIG. 11 is a schematic diagram of a solution in which a quantity of encoding parameters used for decoding is decreased according to an embodiment of this application.

As shown in FIG. 10, an embodiment of the present invention further provides a polar decoding apparatus 100, including: an obtaining module 101, a determining module 102, and a decoding unit 103. The decoding unit 103 may further include a decoding module 1031 and a check module 1032. The obtaining module 101 is configured to perform S71, and the determining module 102 is configured to perform S72. The decoding module 1031 is configured to perform S73, to generate a decoding result. The check module 1032 is configured to perform cyclic redundancy check in S75, to verify the decoding result. Each unit or module in the apparatus 100 may be implemented in a software or hardware form. This is not limited in this embodiment.

A decoding process including a descrambling operation is specifically described with reference to the accompanying drawings. For the terminal 30, communications information received or processed by the terminal 30 may include information of another terminal. For example, after the demodulation apparatus 3012 performs demodulation, an obtained demodulation soft value exists in a form of a polar code sequence. The polar code sequence may include a plurality of candidate polar code sequences, and the decoding apparatus 3011 may perform decoding based on blind detection on the plurality of candidate polar code sequences in a parallel or serial manner. In other words, not all of the plurality of candidate polar code sequences may be specific to the decoding apparatus 3011 currently performing the decoding or the terminal 30. Only one or more candidate polar code sequences in the plurality of candidate polar code sequences belong to the terminal 30, and the other candidate polar code sequences belong to another terminal. In this application scenario, the access network device 20 sends a data flow. The data flow includes data of a plurality of terminals. The data is generalized data or information, and may include service data or control information. The plurality of terminals each can receive the data flow, and demodulate the data flow by using a demodulation apparatus, to generate a soft value existing in a form of a plurality of candidate polar code sequences. Further, after obtaining decoding results of the plurality of candidate polar code sequences, a decoding apparatus of each terminal needs to further identify a decoding result of a candidate polar code sequence belonging to the terminal from the decoding results of the plurality of candidate polar code sequences.

To facilitate identifying data of each terminal by the terminal, the access network device 20 performs, by using an identifier of the terminal when performing encoding, scrambling on the data belonging to the terminal. For example, the identifier may be a radio network temporary identifier of each terminal. For the terminal 30, the terminal 30 needs to perform descrambling on decoding data of the plurality of candidate polar code sequences by using the identifier corresponding to the terminal 30, to identify decoding data belonging to the terminal 30. Specifically, the decoding data on which descrambling is successfully performed by using the radio network temporary identifier of the terminal 30 belongs to the terminal 30.

Figure 12A:
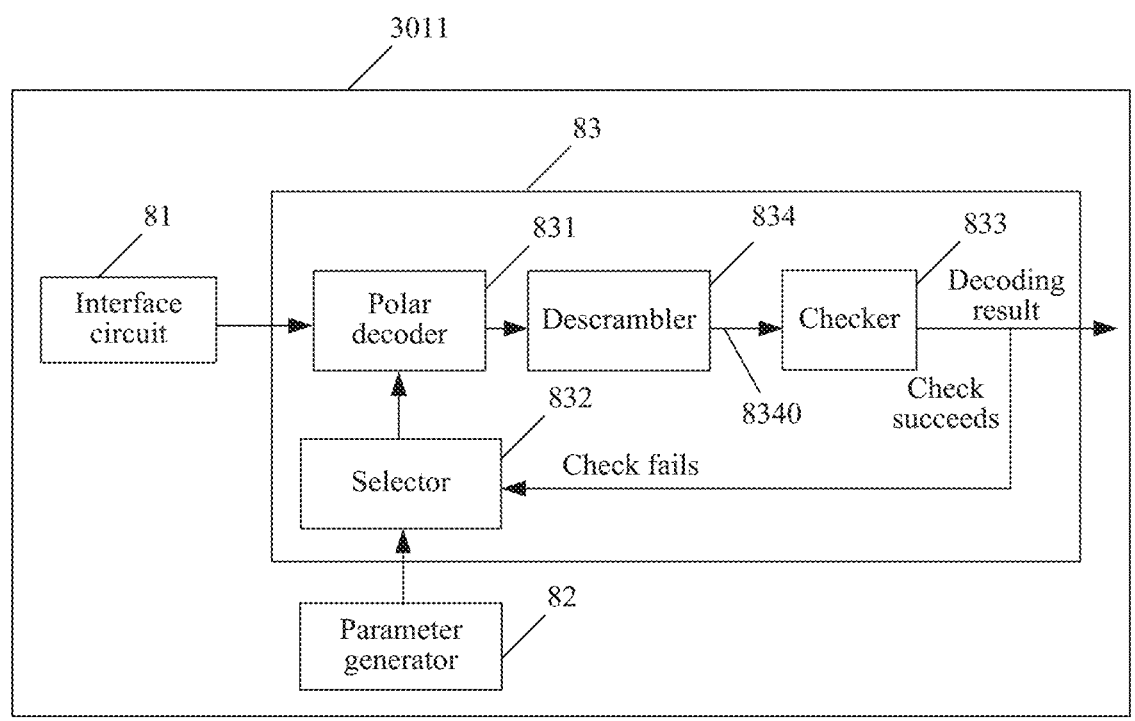
FIG. 12A is a schematic structural diagram of a polar decoding apparatus in a hardware form in a serial decoding manner according to an embodiment of this application.

In an example, the decoding unit 103 in FIG. 10 may further include a descrambling module 1033 performing a descrambling operation function. In another example, for the decoding apparatus 3011 implemented by hardware, refer to FIG. 12A. A difference between FIG. 12A and FIG. 8 is that, in FIG. 12A, a descrambler 834 performing a descrambling operation is placed in front of the checker 833. The descrambler 834 is configured to perform step S74 of the method shown in FIG. 7. The descrambler 834 performs descrambling on a decoding result, to obtain a descrambled result 8340. The result 8340 exclusively belongs to the terminal 30 in which the decoding apparatus 3011 is located but does not belong to another terminal. The result may be a decoding result that the descrambling succeeds or the descrambling fails. Once the descrambling succeeds, a successfully descrambled decoding result 8340 is further sent to the checker 833 for performing the check in S75, to determine whether the check succeeds.

For example, although only some of the candidate polar code sequences are scrambled by using the identifier of the terminal 30 in which the decoding apparatus 3011 is located, the decoding apparatus 3011 still needs to perform decoding and descrambling operations on the plurality of candidate polar code sequences based on the blind detection. Regardless of whether the decoding apparatus 3011 is implemented by software, hardware, or a combination of software and hardware, the plurality of candidate polar code sequences may be processed in both a parallel manner and a serial manner. This is separately described below.

The following describes the decoding apparatus 3011 that performs decoding in a serial manner. It is assumed that the decoding apparatus 3011 is implemented by hardware. The decoding apparatus 3011 shown in FIG. 12A may receive a plurality of candidate polar code sequences by using an interface circuit, and perform serial polar decoding in the polar decoder 831, to obtain decoding results of the plurality of candidate polar code sequences. The checker 833 may perform descrambling on the decoding results by using the radio network temporary identifier of the terminal 30 in which the checker 833 is located. The decoding results may include decoding sequences corresponding to the plurality of candidate polar code sequences. Only some of the decoding sequences belong to the terminal 30, that is, may be successfully descrambled. One or more decoding sequences on which descrambling fails may be discarded. One or more decoding sequences on which descrambling succeeds are included in the descrambled result 8340, and are considered as data or information belonging to the terminal 30. Moreover, cyclic redundancy check is performed to determine whether the check succeeds. When the check succeeds, the one or more decoding sequences on which descrambling succeeds are output as a result. The result is considered as recovery of original data sent by a communications peer, for example, the access network device 20.

Figure 12B:
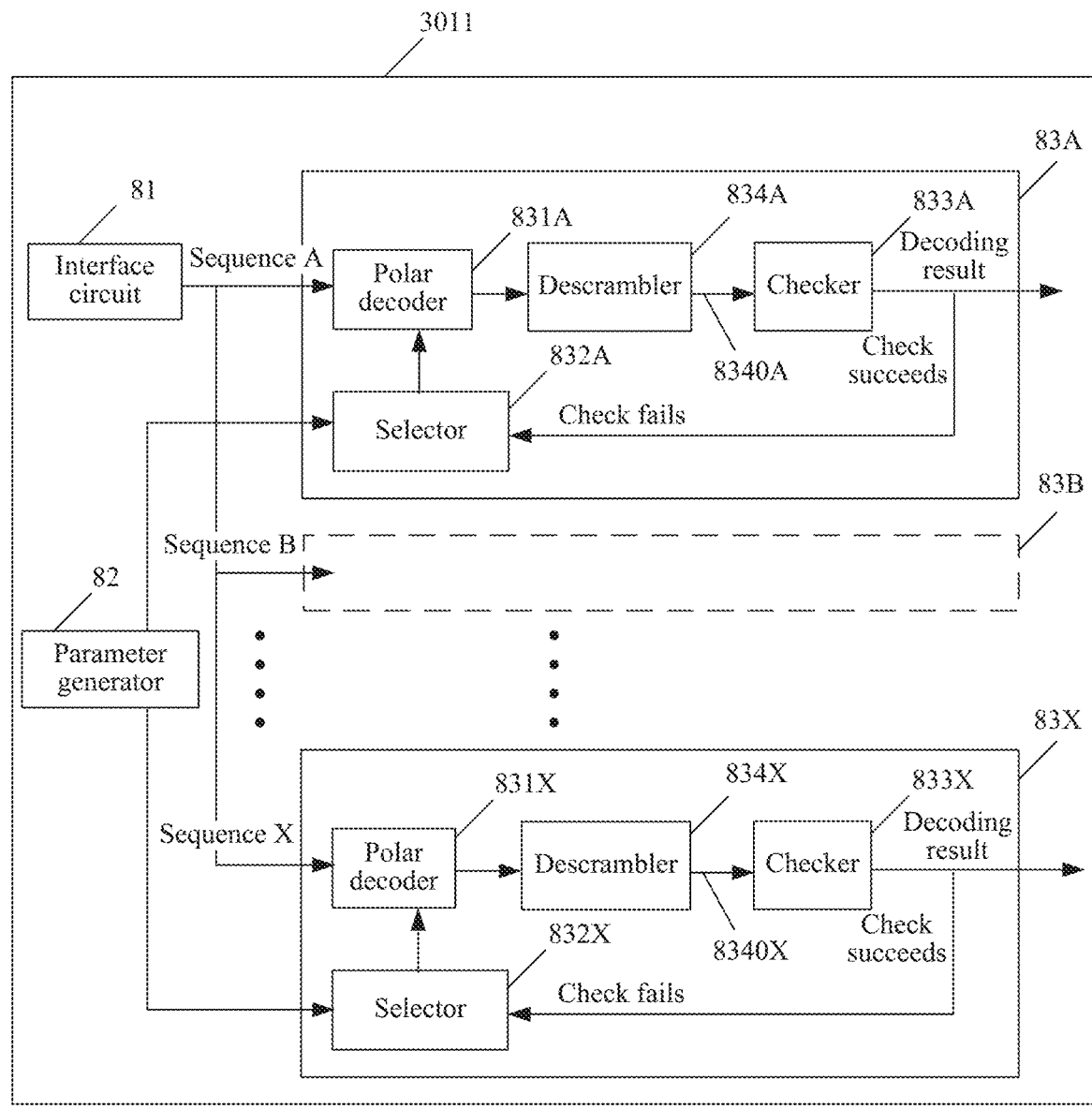
FIG. 12B is a schematic structural diagram of a polar decoding apparatus in a hardware form in a parallel decoding manner according to an embodiment of this application.

The following describes, with reference to FIG. 12B, the decoding apparatus 3011 that performs decoding in a parallel manner. It is assumed that the decoding apparatus 3011 is implemented by hardware. In addition to an interface circuit 81 and a parameter generator 82 shown in FIG. 12A, the decoding apparatus 3011 shown in FIG. 12B may include a plurality of decoders, for example, a decoder 83A, a decoder 83B, . . . , and a decoder 83X. For each decoder, refer to the descriptions of a decoder 83 in FIG. 12A. After receiving a plurality of candidate polar code sequences, the interface circuit 81 may respectively allocate the plurality of candidate polar code sequences, that is, a sequence A, a sequence B, . . . , and a sequence X, to corresponding decoders to perform decoding, so that the plurality of decoders synchronously perform processing in parallel. It may be understood that, because the parallel decoding manner is used, compared with the decoding apparatus in FIG. 12A, the decoding apparatus in FIG. 12B has a higher decoding speed. On the contrary, when the serial decoding manner in FIG. 12A is used, that is, only one set of decoding hardware resources is used to perform decoding on the plurality of candidate polar code sequences in sequence.

This can effectively reduce consumption of hardware resources in the decoding, and facilitate reducing power consumption of operation. In FIG. 12B, the parameter generator 82 is shared by the plurality of decoders. It may be understood that each decoder in FIG. 12B may have its own parameter generator. That is, each decoder includes one parameter generator (the extension mode is not shown in the figure). This is not limited in this embodiment.

In the descriptions of the foregoing embodiment, it is assumed that the decoding apparatus 3011 exists in a hardware form. If the decoding apparatus 3011 is implemented by software, the foregoing serial decoding and parallel decoding manners may also exist. For the parallel decoding manner, it is equivalent that the plurality of candidate polar code sequences are synchronously processed by the processor 91 in FIG. 9 by using a plurality of software operation processes. A computation amount of software code executed at the same time is relatively large, to increase an operation speed. Correspondingly, the serial decoding manner can be used to reduce consumption of software resources, and enabling only one software operation process helps reduce power consumption of the processor 91.

The foregoing embodiments describe the polar decoding apparatus and the method performed by the apparatus. The following further describes how to obtain a plurality of first encoding parameters used for the blind detection in the polar decoding mentioned in the embodiments of the present invention. As described in the foregoing embodiments, the plurality of first encoding parameters are some but not all of a set including a plurality of candidate encoding parameters, and are equivalent to the plurality of first encoding parameters whose quantity is smaller and that are obtained after a quantity of the plurality of candidate encoding parameters is confined. Regardless of whether the plurality of first encoding parameters whose quantity is decreased are selected from the decoding apparatus 3011 or preconfigured in the decoding apparatus 3011, the foregoing nested feature is fully considered, so that complexity is reduced in a case of acceptable performance reduction.

In a possible implementation A, as shown in FIG. 4, it is assumed that a code length N of a polar code sequence is 32, and an information bit length in a polar code is selected from a preset information bit length set M, where M={K1, K2, K3}={17, 12, 10}. Therefore, a plurality of candidate encoding parameters are respectively [32_17], [32_12], and [32_10]. Due to existence of the nested feature, decoding based on blind detection may be performed by using only a information bit length of M=17. To be specific, a first encoding parameter [N_K] generated by the parameter generator 82 is [32_17], so that the other two second encoding parameters [32_12] and [32_10] are omitted. In other words, the two encoding parameters are excluded from being used for the blind detection, to reduce a quantity of the plurality of candidate encoding parameters.

In another possible implementation B, as shown in FIG. 4, for a code length N=32, an information bit length in a polar code is selected from a preset information bit length set M, where M={K1, K2, K3}={17, 12, 10}. Two first encoding parameters [N_K] generated by the parameter generator 82 may be [32_17] and [32_12], so that one second encoding parameter [32_10] is omitted. Therefore, top two encoding parameters having a largest information bit length are selected from a plurality of candidate parameters [32_17], [32_12], and [32_10], and an encoding parameter having a smallest information bit length is omitted. Therefore, for a plurality of candidate encoding parameters having a same code length, each candidate encoding parameter has its own candidate information bit length, and one or more largest candidate information bit lengths are selected.

Figures 14, 15:
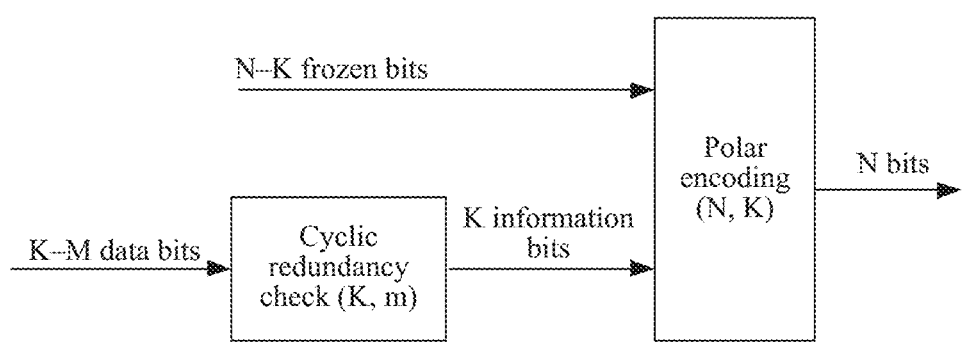
FIG. 14 is a schematic diagram of another solution in which a quantity of encoding parameters used for decoding is decreased according to an embodiment of this application.
FIG. 15 is a schematic diagram of a polar encoding process according to an embodiment of this application.

To facilitate understanding, this embodiment is described with reference to a polar encoding process in FIG. 15. It is assumed that an encoding operation is performed by the access network device 20. In FIG. 15, a cyclic redundancy check (K, m) operation is performed on K−m data bits that are used as original data, to obtain K bits including the K−m data bits and m redundant bits. The K bits are considered as information bits. The m redundant bits are only used to implement the cyclic redundancy check, and do not carry specific information. The other K−m data bits are information needing to be transmitted by the access network device 20 to the terminal 30, and may include service data, control information, or the like. Further, a polar encoding (N, K) operation is performed in an encoding apparatus of the access network device 20. During the encoding, the K information bits and N-K frozen bits are used to generate an N-bit polar code sequence.

It is assumed that, for the encoding process in FIG. 15, the code length N is 32, and an actually used information bit length K is a smallest value in the preset information bit length set M. It is still assumed that M={K1, K2, K3}={17, 12, 10}, the information bit length K actually used for decoding is 10. For the terminal 30, a first encoding parameter [N_K] that may be used in a decoding operation is [32_17], or [32_17] and [32_12]. To be specific, the decoding apparatus 3011 in the terminal 30 uses a larger K value 17 or 12 to perform decoding based on blind detection, to obtain a decoding result. Further, when needing to perform the cyclic redundancy check for the decoding result, the decoding apparatus 3011 still needs to traverse the three candidate encoding parameters: [32_17], [32_12], and [32_10]. Because K that is actually used in the encoding is 10, check fails when the encoding parameters [32_17] and [32_12] are used for the check, and the check succeeds only when the encoding parameter [32_10] is used. As described in the foregoing embodiments, because a computation amount of the checker 833 in the decoding apparatus 3011 is less than that of the polar decoder 831, such traversing does not significantly increase operation complexity. Operations in this embodiment of the present invention are simplified by simplifying the polar decoding.

It may be understood that, in the foregoing implementation A or implementation B, each of one or more information bit lengths that are finally used for the blind detection is greater than an information bit length that is excluded from being used for the blind detection, to fully use an overlapping/nested feature of the polar code. Specifically, referring to FIG. 4, it is assumed that the implementation A is used as an example for description, two options K=12 and K=10 are excluded from being used for the blind detection, and only the first encoding parameter [32_17] is used. That is, only the information bit length K=17 is used. Due to existence of the overlapping/nested feature, when the first encoding parameter [32_17] is used to perform decoding based on the blind detection, some frozen bits in the two options K=12 and K=10 are considered as information bits and decoded. Replacement of a frozen bit with an information bits results in a loss of information 0 or 1 of the replaced frozen bit. That is, prior information of the frozen bit is lost during the decoding. This affects decoding accuracy or a decoding success rate to some extent. For example, if an actual information bit length of a polar code sequence is K=10, when performing the blind detection, the decoding apparatus 3011 may still use the information bit length K=17 to decode the polar code sequence and obtain a decoding result.

However, the decoding accuracy may be slightly reduced due to related operations, and the loss of the prior information slightly has very little impact on performance without affecting implementation of the solution. Further, to balance the impact, a person skilled in the art may determine, in a design process by performing a simulation test on a related method or actually performing a test on a sample product based on the method, whether the replacement mode satisfies a performance requirement of a wireless communications system, to determine whether a related solution is used in the polar decoding.

Specifically, a person skilled in the art may perform simulation for a particular application scenario in a design process, to obtain simulation data, and analyze the simulation data to determine whether the foregoing solution is feasible in the particular application scenario. For example, after a decoding result is obtained by using the method, the decoding result is further used to consider whether an accuracy requirement of wireless communication is satisfied. Specifically, a probability that the decoding result is correct or wrong may be detected by using a simulation test. For example, a bit error rate is used to measure whether the accuracy requirement is satisfied. A person skilled in the art may find that, when a related solution of the embodiments is used in many communication application scenarios, a related accuracy requirement can be satisfied, and decoding complexity is reduced. Therefore, the solution designs in the embodiments are feasible in most of communications application scenarios.

Optionally, the polar encoding and polar decoding technologies may be applied to various data flows in wireless communication. The data flow may include service data or control information. In other words, related technologies are applicable to various data channels, control channels, pilot channels, and the like. In an application scenario, the polar code technology is applied to a control channel in wireless communication, for example, a 5G control channel. A person skilled in the art analyzes, based on simulation data, whether the foregoing method is feasible on the control channel. For example, the analysis may be performed based on a false alarm rate or a residual error rate of the decoding result. If the false alarm rate or the residual error rate reaches a limitation of a preset requirement, it may be considered that the foregoing method is applicable to the particular application scenario. The false alarm rate is a probability that the terminal incorrectly detects, in the control channel, control information that does not belong to the terminal. The residual error rate is a probability that the terminal does not successfully detect, in the control channel, control information belonging to the terminal.

For the foregoing implementation A, only the largest information bit length is used for the blind detection. To be specific, for a plurality of candidate encoding parameters having a same code length, only one encoding parameter is selected, and the decoding complexity is reduced as much as possible. For the implementation B, more than one information bit length is used for the blind detection. To be specific, a plurality of first encoding parameters used for the blind detection exist, the decoding accuracy may be slightly increased. A quantity of one or more information bit lengths used for the blind detection may be flexibly adjusted based on an actual design requirement, to implement a compromise between the decoding complexity and the decoding accuracy.

Further, in a set including a plurality of candidate encoding parameters, a plurality of different code lengths may exist. N is usually $2^n$, n is a positive integer, and N has a plurality of possible values when a value of n varies. Each code length N corresponds to a plurality of different information bit lengths K. For each of a plurality of candidate encoding parameters having a same code length, the foregoing method may be used. To be specific, one or more first information bit lengths used for decoding are determined for each code length N, and one or more second information bit lengths are excluded, to reduce complexity of the blind detection in the decoding. As shown in FIG. 11. FIG. 11 is a schematic diagram of a solution in which a quantity of encoding parameters used for decoding is decreased. In the embodiments of the present invention, a plurality of first information bit lengths belong to a type of information bit length that is used for the decoding, and values of the plurality of first information bit lengths are different from each other. The plurality of second information bit lengths belong to a type of information bit length that is excluded, and values of the plurality of second information bit lengths are different from each other.

On a left side of FIG. 11, a plurality of candidate encoding parameters [N K] are shown, and respectively are [128 47], [128 49], [128 59], [128 62], [256 60], [256 62], [256 64], [256 73], [512 79], [512 80], [512 81], [512 83], [1024 90], and [1024 100], where values of the code length N may be 128, 256, 512, and 1024. Corresponding to each N length, K has a plurality of possible values. On a right side of FIG. 11, a plurality of first encoding parameters used for polar decoding may be determined, and a quantity of the plurality of first encoding parameters is less than a quantity of the plurality of candidate encoding parameters. Specifically, corresponding to N=128, two largest values 59 and 62 of K are retained, and two smaller values 47 and 49 of K are excluded. Corresponding to N=256, two largest values 64 and 73 of K are retained, and two smaller values 60 and 62 of K are excluded. Corresponding to N=512, a largest value 83 of K is retained, but three smaller values 79, 80, and 81 of K are excluded. Corresponding to N=1024, a largest value 100 of K is retained, but a smaller value 90 of K is excluded. Corresponding to different N values, a quantity of retained K values specific to N may be different. A person skilled in the art may perform the selection based on an actual performance requirement, and may specifically use the foregoing simulation method to determine appropriate first encoding parameters. Due to existence of the nested feature, specific to one N value, when one or more retained largest K values are used to perform blind detection on a polar code sequence actually having a smaller K value, some frozen bits in the polar code sequence is considered as information bits for decoding. This sacrifices a part of performance, but reduces complexity. After a quantity of encoding parameters is confined, on the right side of FIG. 11, retained encoding parameters used for the blind detection are shown, and specifically are [128 59], [128 62], [256 64], [256 73], [512 83], and [1024 100].

Different from a series of embodiments including an embodiment corresponding to FIG. 11, alternatively, in another implementation, a plurality of candidate encoding parameters may be grouped and a quantity of the candidate encoding parameters is further decreased. The implementation is described by using an example. In an encoding parameter set including a plurality of candidate encoding parameters, it is assumed that code lengths are all N=32. In this case, it is assumed that a plurality of different information bit lengths K exist. For example, it is assumed that a preset information bit length set M exists, where M={19, 17, 13, 9, 7, 5}. Therefore, the plurality of candidate encoding parameters may be [32_19], [32_17], [32_13], [32_9],

[32_17], and [31_5]. The preset information bit length set M may be further divided into a plurality of groups. For example, a first group includes {19, 17, 13}, and a second group includes {9, 7, 5}. One or more information bit lengths having a smaller length may be separately excluded from the two groups. For example, K=17 and K=13 are excluded from the first group, and K=5 is excluded from the second group. In this case, the remaining information bit lengths K are 19, 9, and 7. To be specific, remaining encoding parameters used to perform the blind detection are [32_19], [32_9], and [32_7]. Whether the encoding parameters satisfy a performance requirement of a wireless communications system may be determined through simulation, to determine whether a related solution is used in polar decoding.

It may be understood that, when the foregoing preset information bit length set M is grouped and narrowed, in addition to the foregoing grouping manner, there may be another grouping manner. In an alternative implementation of the foregoing implementation, the first group may alternatively include {19, 17}, and the second group may alternatively include {13, 9, 7, 5}. One or two smallest values may be excluded from each group. For example, K=17 is excluded from the first group, and K=5 is excluded from the second group. In this case, the remaining encoding parameters used to perform the blind detection are [32_19], [32_13], [32_9], and [32_17]. Alternatively, the first group may alternatively include {19, 17, 13, 9}, the second group may alternatively include {7, 5}, and one or two smallest values are excluded from each group. For example, K=17, K=13, and K=9 are excluded from the first group, and K=5 is excluded from the second group. In this case, the remaining encoding parameters used to perform the blind detection are [32_19] and [32 7]. Therefore, there may be a plurality of implementations of grouping a plurality of candidate information bit lengths in a preset information bit length set.

In addition, when the preset information bit length set M is grouped and narrowed, the foregoing narrowing solution may be applied to only one or more groups of the preset information bit length set M, and the foregoing narrowing solution is not applied to the other one or more groups, a value in the group is directly used. For example, for the first group {19, 17, 13, 9}, K=17, K=13, and K=9 may be excluded. The solution is not applied to the second group {7, 5}, but K=7 and K=5 are directly retained. In this case, the remaining encoding parameters used to perform the blind detection are [32_19], [32 7], and [32 5]. Therefore, for the plurality of groups, as long as the solution of this embodiment is applied to only some groups, complexity of the blind detection may be reduced. Therefore, when the preset information bit length set M includes a plurality of groups, at least one group of the plurality of groups may be divided to at least one third information bit length and at least one fourth information bit length, and each of the at least one third information bit length is greater than the at least one fourth information bit length; the at least one first information bit length finally used in the blind detection includes at least one third information bit length in each group; and the at least one second information bit length finally excluded from being used for the blind detection includes at least one fourth information bit length in each group. The preset information bit length set M may be grouped by a person skilled in the art based on experience or based on a requirement of simulation data in a design process. This is not limited in this embodiment. In this embodiment, a plurality of third information bit lengths in one group belong to a type of information bit length, in the group, used for decoding, and values of the plurality of third information bit lengths are different from each other. A plurality of fourth information bit lengths in the group belong to a type of information bit length that is excluded, and values of the plurality of fourth information bit lengths are different from each other.

Based on the foregoing embodiment, to reduce complexity of the blind detection, the plurality of first encoding parameters used for the blind detection includes at least one third encoding parameter, and the at least one second encoding parameter excluded from being used for the blind detection includes at least one fourth encoding parameter. The at least one third encoding parameter and the at least one fourth encoding parameter belong to the encoding parameter set, and both include a same first code length. Because the at least one fourth encoding parameter is excluded from the plurality of candidate encoding parameters, and is not used for the blind detection, the encoding parameter set is narrowed. A manner in which a quantity of the plurality of candidate encoding parameters is directly decreased may be considered as a first narrowing manner, and a manner in which the plurality of candidate encoding parameters are grouped and the quantity of the plurality of candidate encoding parameters is further decreased may be considered as a second narrowing manner. Regardless of which narrowing manner is used, for a plurality of candidate encoding parameters having a particular code length N, the at least one third encoding parameter obtained after a narrowing manner is used includes one or more candidate encoding parameters having one or more largest first information bit lengths. In other words, for each code length, any excluded second information bit length is not largest in the preset information bit length set. The two narrowing manners are further described below.

In the first narrowing manner shown in FIG. 11, a first information bit length included in each third encoding parameter is greater than at least one second information bit length included in the at least one fourth encoding parameter. Alternatively, among all candidate encoding parameters having the first code length, the at least one third encoding parameter is the one or more candidate encoding parameters having one or more largest first information bit length. In other words, among a large quantity of encoding parameters, as long as a plurality of candidate encoding parameters [M_K1], . . . , and [M_KX] include a same code length M, where X is a positive integer greater than or equal to 2, one or more encoding parameters having a largest information bit length may be selected from the plurality of candidate encoding parameters, to exclude the at least one second encoding parameter having a smaller information bit length, and obtain a narrowed encoding parameter set. Only a plurality of first encoding parameters included in the narrowed set are used for the blind detection.

In the second narrowing manner, some or all of the plurality of groups each may include at least one fifth encoding parameter and at least one sixth encoding parameter. Each of at least one third information bit length included in the at least one fifth encoding parameter is greater than at least one fourth information bit length included in the at least one sixth encoding parameter; the at least one third encoding parameter used for the blind detection includes the at least one fifth encoding parameter; and the at least one fourth encoding parameter excluded from being used for the blind detection includes the at least one sixth encoding parameter. When there is a quite large quantity of candidate encoding parameters, by grouping the plurality of candidate encoding parameters based on working experience or simulation during design, a person skilled in the art may select an encoding parameter from at least one group or decrease a quantity of encoding parameters of the at least one group, to effectively exclude some encoding parameters, and achieve a better effect.

The second narrowing manner is further described below with reference to the accompanying drawings. Referring to FIG. 14, different from FIG. 11, FIG. 14 is a schematic diagram of another solution in which a quantity of encoding parameters used for decoding is decreased. On a left side of FIG. 14, a plurality of candidate encoding parameters are shown, and are [128 47], [128 49], [128 59], [128 62], [128 64], [128 67], [256 60], [256 62], [256 64], [256 73], [256 75], [512 79], [512 80], [512 81], [512 83], [1024 90], [1024 100], and [1024 105]. Values of a code length N may be 128, 256, 512, and 1024, and correspond to different information bit lengths K. Slightly different from the solution shown in FIG. 11, Corresponding to each code length in FIG. 14, a plurality of K values may be divided into a plurality of groups. For example, in this solution, the plurality of K values corresponding to each code length N value are divided into two groups. It may be understood that, in another division manner, a quantity of groups may be at least 3. Corresponding to each code length N in FIG. 14, the two groups of the information bit lengths K corresponding to the code length N are separately narrowed. For example, one or more largest K values are selected from each group. Corresponding to the code length N=128, the two groups corresponding to the code length N are separately narrowed. Two largest information bit lengths K=59 and K=62 are selected from a first group, and a largest information bit length K=67 is selected from a second group. Corresponding to the code length N=256, the two groups corresponding to the code length N are separately narrowed. A largest information bit length K=62 is selected from a first group, and two largest information bit lengths K=73 and K=75 are selected from a second group. Corresponding to the code length N=512, only a first group is narrowed without narrowing a second group. Therefore, a largest information bit length K=80 is selected from the first group, and both information bit lengths K=81 and K=83 are selected from the second group. Corresponding to the code length N=1024, a largest information bit length K=100 is selected from a first group for narrowing the first group. Because only one information bit length K=105 exists in a second group, there is no need to narrow the second group. In conclusion, for any code length, each group of information bit lengths that corresponds to the code length is selectively narrowed, to exclude an information bit length not used for blind detection, and obtain a decreased quantity of encoding parameters. On a right side of FIG. 14, a decreased quantity of encoding parameters used for the blind detection are shown, and specifically are [128 59], [128 62], [128 67], [256 62], [256 73], [256 75], [512 80], [512 81], [512 83], [1024 100], and [1024 105].

Regardless of whether a quantity of a plurality of encoding parameters having a particular code length N is directly decreased or the plurality of encoding parameters are grouped and the quantity of the plurality of encoding parameters is decreased, a decreased quantity of encoding parameters each include one or more candidate encoding parameters having one or more largest information bit lengths. To be specific, one or more excluded candidate encoding parameters do not include at least one largest information bit length. However, not all information bit lengths of each obtained first encoding parameter may be greater than an information bit length of any second encoding parameter excluded from being used for the blind detection. Therefore, for one code length N, a retained first information bit length used for the blind detection includes a largest information bit length and a plurality of other possible information bit lengths, and the excluded second information bit length is less than the largest information bit length. This procedure is equivalent to performing simplification on an original set including a plurality of candidate encoding parameters, to obtain a simplified set. Values of information bit lengths in a plurality of first encoding parameters in the simplified set are different from each other.

In a possible implementation solution, a plurality of candidate encoding parameters may have only a same code length. In this case, the terminal 30 performs, when the fixed code length is used, the blind detection by using different information bit lengths. Alternatively, in an alternative implementation, the terminal 30 may obtain a configured code length from the access network device 20. To be specific, the access network device 20 may inform the terminal 30 of a code length used for decoding, and the terminal 30 performs, when the code length is used, the blind detection by using different information bit lengths.

However, in another more common case, for example, in FIG. 11 and FIG. 14, a plurality of different code lengths exist. It may be understood that, because a code length N is not fixed, performance of a communications system is better. The plurality of code lengths may be preconfigured in the terminal 30 based on a wireless communication protocol or may be configured by the access network device 20 for the terminal 30. In this case, the terminal 30 needs to perform the blind detection based on the plurality of code lengths and different information bit lengths corresponding to each code length.

Optionally, the preset information bit length set in the foregoing embodiment is preconfigured in the terminal 30 further based on the wireless communication protocol or is configured by the access network device 20 for the terminal 30. According to the foregoing solution, both the terminal 30 and the access network device 20 may learn of the plurality of different code lengths required for the blind detection and the plurality of candidate information bit lengths corresponding to each code length, namely, the preset information bit length set. When communication is specifically performed, the access network device 20 and the terminal 30 separately use different encoding parameters. To be specific, the access network device 20 may perform polar encoding based on an agreement in a wireless communication protocol or a configuration of the access network device 20. The terminal 30 uses, based on the solution mentioned in the foregoing embodiment, the decreased quantity of encoding parameters to perform polar decoding, to reduce complexity.

Figure 13:
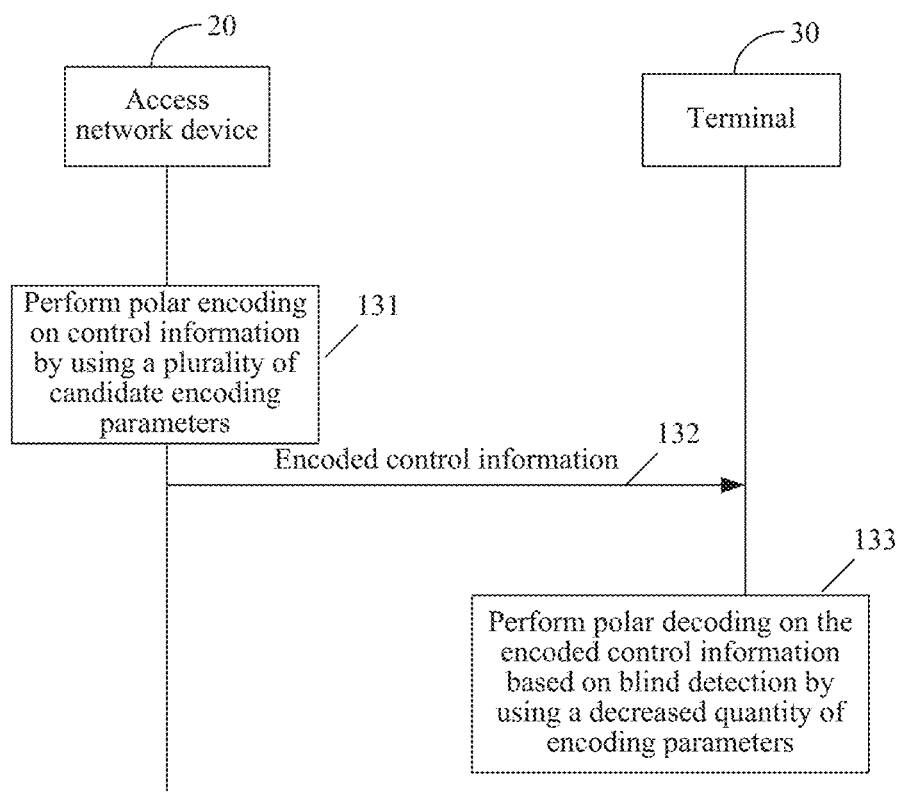
FIG. 13 is a schematic flowchart of a wireless communications process based on a polar code according to an embodiment of this application.

With development of 5G technologies, power consumption and a communication delay become more important. According to the polar decoding solution mentioned in the embodiments of the present invention, because complexity of the blind detection is reduced, a delay and power consumption of wireless communication may be reduced, to better adapt to a future 5G communication requirement. For example, the foregoing polar decoding solution may be applied to decoding in a 5G control channel, for example, applied to an Enhanced Mobile Broadband (eMBB) control channel. For example, as shown in FIG. 13, FIG. 13 is a schematic diagram of a wireless communication process based on a polar code. In S131, an access network device 20 performs polar encoding on control information used as a data source, to generate a polar code sequence, and may use any code length and any one of a plurality of candidate information bit lengths in a preset information bit length set during the encoding, that is, use a plurality of candidate encoding parameters during the polar encoding. Optionally, encoded control information is eMBB control information. Specifically, the access network device 20 uses a plurality of candidate encoding parameters as a universal set, and selects one parameter from the universal set to perform encoding. Although this embodiment is described by using an example in which the control information is encoded, it may be understood that the data source may alternatively include data sent by the access network device 20 to a terminal 30, or other communication information such as pilot information. In S132, the access network device 20 sends, to the terminal 30 on a control channel, the control information on which the polar encoding is performed, namely, the polar code sequence formed through the polar encoding. In S133, the terminal 30 uses a plurality of encoding parameters obtained after a quantity of the encoding parameters is decreased based on a nested feature, to perform polar decoding on the received polar code sequence based on blind detection. Therefore, during the blind detection by the terminal 30, a quantity of the at least one first information bit length corresponding to any code length is less than a quantity of a plurality of candidate information bit lengths used by the access network device 20. To be specific, a decreased quantity of encoding parameters used for the decoding is less than a quantity of the candidate encoding parameters used for the encoding, thereby relatively reducing decoding complexity.

The embodiments of the present invention mainly provide a solution in which complexity of blind detection is simplified, and the solution is described by using a terminal as an example. It may be understood that the solution may also be applied to another wireless communication scenario in which blind detection is required. In the foregoing embodiments, a solution of the related solution may be wholly or partially implemented by software, hardware, firmware, or a combination thereof. When the foregoing method is performed by using software, the method may be wholly or partially implemented in a form of a computer program product. The computer program product includes a plurality of computer executable instructions, and is executed by a processor, for example, referring to FIG. 9. When the computer program instruction is loaded and executed in the computer or the processor, some or all of the procedures or functions described in the embodiments of the present invention are generated. The computer program product may be stored in a computer readable medium, for example, the memory 302 in FIG. 2. The computer program product may be various forms of nonvolatile memories, a volatile memory, a read-only memory, a random access memory, a flash memory, a compact disc, a magnetic disk, a server having a storage function, or the like.

The apparatus embodiments provided in this application are merely examples. For example, the unit division shown in FIG. 10 is merely logical function division and may be other division in actual implementation. For example, a plurality of units or components may be combined or integrated into another system. Coupling between the units may be implemented by using some interfaces. The interfaces are usually electrical communications interfaces, but may alternatively be mechanical interfaces or interfaces in another form. Therefore, the units described as separate parts may or may not be physically separate, may be located in one place, or may be distributed in different positions on a same device or different devices. For example, the polar decoder 831 and the checker 833 in FIG. 8, FIG. 12A, or FIG. 12B may be integrated into a circuit, a module, or a software unit.

The above descriptions are only examples of specific implementations of the present invention. Any variation or replacement readily figured out by a person skilled in the art within the technical scope disclosed in the foregoing embodiments shall fall within the protection scope of the present invention.

The invention claimed is:

1. A polar decoding method, comprising:
obtaining a polar code sequence;
determining at least one first information bit length corresponding to a code length of the polar code sequence; and
decoding the polar code sequence based on blind detection by using the code length and the at least one first information bit length, wherein the at least one first information bit length is a part of a preset information bit length set corresponding to the code length, wherein a remaining part of the preset information bit length set is at least one second information bit length, wherein the at least one second information bit length is excluded from being used for the blind detection, and wherein each second information bit length is less than one or more information bit lengths in the at least one first information bit length.

2. The method according to claim 1, wherein each of the at least one first information bit length is greater than the at least one second information bit length.

3. The method according to claim 1, wherein the preset information bit length set comprises a plurality of groups, wherein at least one group of the plurality of groups comprises at least one third information bit length and at least one fourth information bit length, and wherein each of the at least one third information bit length is greater than the at least one fourth information bit length:
wherein the at least one first information bit length comprises the at least one third information bit length; and
wherein the at least one second information bit length comprises the at least one fourth information bit length.

4. The method according to claim 1, wherein the determining at least one first information bit length corresponding to a code length of the polar code sequence comprises selecting the at least one first information bit length from the preset information bit length set.

5. The method according to claim 1, wherein the at least one first information bit length is preconfigured in an apparatus performing the decoding.

6. The method according to claim 1, wherein the code length comprises a plurality of code lengths;
wherein the determining at least one first information bit length corresponding to a code length of the polar code sequence comprises determining at least one first information bit length corresponding to each code length of the plurality of code lengths; and
wherein the decoding the polar code sequence based on blind detection by using the code length and the at least one first information bit length comprises decoding the polar code sequence based on the blind detection by using each code length and the at least one first information bit length corresponding to the code length.

7. The method according to claim 6, wherein the plurality of code lengths are preconfigured based on a wireless communication protocol in an apparatus performing the decoding or are configured for the apparatus by a peer device.

8. The method according to claim 1, wherein the preset information bit length set is preconfigured based on a wireless communication protocol in an apparatus performing the decoding or is configured for the apparatus by a peer device.

9. The method according to claim 8, wherein the polar code sequence is generated from performing polar encoding on a data source by the peer device, and wherein the preset information bit length set is used in the polar encoding.

10. The method according to claim 1, wherein the polar code sequence comprises a plurality of candidate polar code sequences; and
wherein the decoding the polar code sequence based on blind detection by using the code length and the at least one first information bit length comprises:
decoding the plurality of candidate polar code sequences based on the blind detection in a serial or parallel manner by using the code length and the at least one information bit length to respectively obtain a plurality of decoding results with respect to the plurality of candidate polar code sequences.

11. The method according to claim 10, wherein at least one candidate polar code sequence of the plurality of candidate polar code sequences is scrambled by using an identifier corresponding to an apparatus performing the decoding; and
wherein the method further comprises:
separately descrambling the plurality of decoding results by using the identifier to identify a decoding result corresponding to the at least one candidate polar code sequence belonging to the apparatus.

12. A polar decoding apparatus, comprising:
an interface, the interface configured to obtain a polar code sequence;
a parameter generator, the parameter generator configured to determine at least one first information bit length corresponding to a code length of the polar code sequence; and
a decoder, the decoder configured to decode the polar code sequence based on blind detection by using the code length and the at least one first information bit length, wherein the at least one first information bit length is a part of a preset information bit length set corresponding to the code length, wherein a remaining part of the preset information bit length set is at least one second information bit length, wherein the at least one second information bit length is excluded from being used for the blind detection, and wherein each second information bit length is less than one or more information bit lengths in the at least one first information bit length.

13. The apparatus according to claim 12, wherein each of the at least one first information bit length is greater than the at least one second information bit length.

14. The apparatus according to claim 12, wherein the preset information bit length set comprises a plurality of groups, wherein at least one group of the plurality of groups comprises at least one third information bit length and at least one fourth information bit length, and wherein each of the at least one third information bit length is greater than the at least one fourth information bit length;
wherein the at least one first information bit length comprises the at least one third information bit length; and
wherein the at least one second information bit length comprises the at least one fourth information bit length.

15. The apparatus according to claim 12, wherein the parameter generator is configured to select the at least one first information bit length from the preset information bit length set.

16. The apparatus according to claim 12, wherein the at least one first information bit length is preconfigured in the apparatus.

17. The apparatus according to claim 12, wherein the code length comprises a plurality of code lengths:
wherein the parameter generator is further configured to determine at least one first information bit length corresponding to each code length of the plurality of code lengths; and
wherein the decoder is further configured to decode the polar code sequence based on the blind detection by using each code length and the at least one first information bit length corresponding to the code length.

18. The apparatus according to claim 12, wherein the polar code sequence comprises a plurality of candidate polar code sequences; and
wherein the decoder is further configured to decode the plurality of candidate polar code sequences based on the blind detection in a serial or parallel manner by using the code length and the at least one information bit length to respectively obtain a plurality of decoding results with respect to the plurality of candidate polar code sequences.

19. The apparatus according to claim 18, wherein at least one candidate polar code sequence of the plurality of candidate polar code sequences is scrambled by using an identifier corresponding to the apparatus; and
wherein the apparatus further comprises a descrambler, the descrambler configured to separately descramble, by using the identifier, the decoding results corresponding to the plurality of candidate polar code sequences to identify a decoding result corresponding to the at least one candidate polar code sequence belonging to the apparatus.

20. A polar decoding apparatus, comprising:
at least one processor;
a non-transitory computer-readable storage medium coupled to the at least one processor and storing programming instructions for execution by the at least one processor, the programming instructions instruct the at least one processor to perform operations comprising:
obtaining a polar code sequence;
determining at least one first information bit length corresponding to a code length of the polar code sequence; and
decoding the polar code sequence based on blind detection by using the code length and the at least one first information bit length, wherein the at least one first information bit length is a part of a preset information bit length set corresponding to the code length, wherein a remaining part of the preset information bit length set is at least one second information bit length, wherein the at least one second information bit length is excluded from being used for the blind detection, and wherein each second information bit length is less than one or more information bit lengths in the at least one first information bit length.

* * * * *

UNITED STATES PATENT AND TRADEMARK OFFICE
CERTIFICATE OF CORRECTION

PATENT NO. : 11,012,092 B2
APPLICATION NO. : 16/727655
DATED : May 18, 2021
INVENTOR(S) : Zhi You et al.

Page 1 of 1

It is certified that error appears in the above-identified patent and that said Letters Patent is hereby corrected as shown below:

In the Claims

In Column 30, Line 34, in Claim 3, delete "length:" and insert -- length; --, therefor.

In Column 32, Line 9, in Claim 17, delete "lengths:" and insert -- lengths; --, therefor.

Signed and Sealed this
Tenth Day of August, 2021

Drew Hirshfeld
*Performing the Functions and Duties of the*
*Under Secretary of Commerce for Intellectual Property and*
*Director of the United States Patent and Trademark Office*